(12) United States Patent
Yamada

(10) Patent No.: US 10,326,427 B2
(45) Date of Patent: Jun. 18, 2019

(54) RESONATOR, OSCILLATOR, ELECTRONIC APPARATUS, AND VEHICLE

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 160 days.

(21) Appl. No.: 15/487,855

(22) Filed: Apr. 14, 2017

(65) Prior Publication Data

US 2017/0310300 A1   Oct. 26, 2017

(30) Foreign Application Priority Data

Apr. 26, 2016   (JP) .................................. 2016-088410

(51) Int. Cl.
*H03B 5/32* (2006.01)
*H03H 9/215* (2006.01)
(Continued)

(52) U.S. Cl.
CPC ............... *H03H 9/215* (2013.01); *H03B 5/32* (2013.01); *H03H 9/05* (2013.01); *H03H 9/0542* (2013.01); *H03H 9/0547* (2013.01); *H03H 9/08* (2013.01)

(58) Field of Classification Search
CPC ............ H03B 5/32; H03H 9/21; H03H 9/215; H03H 9/2468; H03H 9/2473;
(Continued)

(56) References Cited

U.S. PATENT DOCUMENTS

| 4,372,173 A | 2/1983 | EerNisse et al. |
| 5,668,329 A | 9/1997 | Petri |

(Continued)

FOREIGN PATENT DOCUMENTS

| JP | S57-108630 A | 7/1982 |
| JP | 2005-123828 A | 5/2005 |

(Continued)

*Primary Examiner* — Levi Gannon
(74) *Attorney, Agent, or Firm* — Oliff PLC

(57) ABSTRACT

A resonator includes: a resonator element that includes a base portion and a resonating arm; and a base. When n is one natural number of 2 or greater and j is 1 or greater and a natural number which is less than or equal to n, the resonator element performs resonations with n inherent resonation modes. In a relationship between arbitrary integers $k_j$ and resonance frequencies $f_j$ corresponding to the n inherent resonation modes, respectively, when $f_1$ represents the resonance frequency of the main resonation of the resonator element and a normalized frequency difference $\Delta f$ is defined by $$\Delta f \equiv \left( \frac{\sum_{j=2}^{n} k_j f_j}{-k_1} - f_1 \right) \Big/ f_1,$$

a relationship of $|\Delta f| \geq 0.03$ is satisfied. The arbitrary integers $k_j$ satisfy relationships of $3 \leq \Sigma_{j=1}^{n} |k_j| \leq 10$ and $n \leq \Sigma_{j=1}^{n} |k_j|$. A ratio of an amount of a change in the resonance frequency of the main resonation, to excitation power that electrically excites the main resonation, is 20 [ppm/μW] or higher.

20 Claims, 30 Drawing Sheets

(51) Int. Cl.
*H03H 9/05* (2006.01)
*H03H 9/08* (2006.01)

(58) Field of Classification Search
CPC .......................... H03H 9/2478; H03H 9/2484; H03H 9/2489; H03H 9/2494
USPC .......................................... 310/370; 331/156
See application file for complete search history.

(56) References Cited

U.S. PATENT DOCUMENTS

| | | | | |
|---|---|---|---|---|
| 8,427,035 | B2* | 4/2013 | Yamada | H01L 41/08 310/370 |
| 2008/0211350 | A1* | 9/2008 | Tanaya | H03H 3/04 310/328 |
| 2009/0102327 | A1* | 4/2009 | Kawashima | H03B 5/36 310/370 |
| 2010/0096953 | A1* | 4/2010 | Iwai | H03H 9/1014 310/370 |
| 2010/0096954 | A1* | 4/2010 | Kawanishi | H03H 9/1014 310/370 |
| 2012/0007685 | A1* | 1/2012 | Yamada | H03H 9/02102 331/156 |
| 2012/0216614 | A1* | 8/2012 | Matsumoto | H03H 9/02 73/504.16 |
| 2012/0293048 | A1* | 11/2012 | Ueno | H03H 9/1021 310/344 |
| 2014/0266485 | A1* | 9/2014 | Yamada | H03H 9/215 331/158 |
| 2014/0292433 | A1* | 10/2014 | Yamada | H03H 9/0547 331/156 |
| 2015/0135931 | A1* | 5/2015 | Yamada | H03H 9/02157 84/410 |
| 2015/0137899 | A1* | 5/2015 | Yamada | H03H 3/04 331/156 |
| 2016/0065173 | A1 | 3/2016 | Nishimura et al. | |
| 2016/0072473 | A1 | 3/2016 | Nishimura et al. | |
| 2016/0322935 | A1 | 11/2016 | Yamada et al. | |

FOREIGN PATENT DOCUMENTS

| | | |
|---|---|---|
| JP | 2005-197946 A | 7/2005 |
| JP | 2005-354649 A | 12/2005 |
| JP | 2006-238001 A | 9/2006 |
| JP | 3885893 B2 | 2/2007 |
| JP | 2015-087263 A | 5/2015 |
| JP | 2015-149592 A | 8/2015 |
| JP | 2016-213807 A | 12/2016 |
| WO | 95/31859 A1 | 11/1995 |
| WO | 2014-185281 A1 | 11/2014 |

* cited by examiner

RESONATOR, OSCILLATOR, ELECTRONIC APPARATUS, AND VEHICLE

CROSS REFERENCE

This application claims benefit of Japanese Application JP 2016-088410, filed on Apr. 26, 2016. The disclosure of the prior application is hereby incorporated by reference herein in its entirety.

BACKGROUND

1. Technical Field

The present invention relates to a resonator, an oscillator, an electronic apparatus, and a vehicle.

2. Related Art

In the related art, a resonator element as disclosed in International Publication No. 2014/185281 is known. The resonator element disclosed in International publication No. 2014/185281 includes a resonating body that has a base portion and three resonating arms extending from the base portion, and the resonating arms flexurally resonate in a Z-axial direction. For example, since such a resonator element has frequency-temperature characteristics of a quadratic equation as indicated by a solid line in FIG. 35, correction is performed such that the frequency-temperature characteristics in an oscillation circuit, which is connected to the resonator element, are indicated by a solid line in FIG. 36. In this manner, a change in frequency due to temperature is reduced, and thus it is possible to obtain a resonator element having a highly accurate frequency.

However, when flexural resonation as a main resonation described above is coupled with an suprious mode other than the flexural resonation and an internal resonance occurs, frequency characteristics of the resonator element locally and steeply change as indicated by a dashed line in FIG. 35. As indicated by a dashed line in FIG. 36, it is difficult to correct this change even by the oscillation circuit, and then it is difficult to further improve accuracy of the frequency.

SUMMARY

An advantage of some aspects of the invention is to provide a resonator, an oscillator, an electronic apparatus, and a vehicle in which it is possible to reduce degradation in accuracy of frequency due to an internal resonance, and thus it is possible to achieve improvement of the accuracy of the frequency.

The invention can be implemented as the following application examples.

A resonator according to an aspect of the invention includes: a resonator element that includes a base portion and a resonating arm extending from the base portion in a first direction; and abase to which the resonator element is attached. When n is one natural number of 2 or greater and j is 1 or greater and a natural number which is less than or equal to n, the resonator element performs resonations with n inherent resonation modes that have different resonance frequencies from one another. The n inherent resonation mode includes an inherent resonation mode of main resonation. In a relationship between arbitrary integers $k_j$ and resonance frequencies $f_j$ corresponding to the n inherent resonation modes, respectively, when $f_1$ represents the resonance frequency of the main resonation and a normalized frequency difference $\Delta f$ is defined by $$\Delta f \equiv \left( \frac{\sum_{j=2}^{n} k_j f_j}{-k_1} - f_1 \right) / f_1,$$

a relationship of $|\Delta f| \geq 0.03$ is satisfied. The arbitrary inters $k_j$ satisfy relationships of $3 \leq \Sigma_{j=1}{}^n |k_j| \leq 10$ and $n \leq \Sigma_{j=1}{}^n |k_j|$. A ratio of a value obtained by normalizing, by the resonance frequency $f_1$ of the main resonation, an amount of a change in the resonance frequency of the main resonation, to a change in excitation power that electrically excites the main resonation, is 20 [ppm/μW] or higher.

In this configuration, it is possible to obtain the resonator in which it is possible to reduce degradation in accuracy of frequency due to an internal resonance, and thus it is possible to achieve improvement of the accuracy of the frequency.

In the resonator of the aspect of the invention, it is preferable to satisfy a relationship of $3 \leq \Sigma_{j=1}{}^n |k_j| \leq 6$.

In this configuration, coupling of the main resonation with another inherent resonation mode is unlikely to occur even in the resonator element that exhibits remarkable low-order nonlinearity, and thus it is possible to reduce resonation leakage of the main resonation due to the internal resonance.

In the resonator of the aspect of the invention, it is preferable that the resonator element includes a pair of resonating arms that is aligned in a second direction intersecting with the first direction and extends from the base portion in the first direction, and resonator element has high-order modes of at least two inherent resonation modes of a second-direction reversed-phase mode in which the pair of resonating arms flexurally resonates in reversed-phases in the second direction, a second-direction same-phase mode in which the pair of resonating arms flexurally resonates in the same phase in the second direction, a third-direction reversed-phase mode in which the pair of resonating arms flexurally resonates in reversed-phases in a third direction which is parallel to a thickness direction of the base portion, a third-direction same-phase mode in which the pair of resonating arms flexurally resonates in the same phase in the third direction, a torsional reversed-phase mode in which the pair of resonating arms is twisted in reversed-phases around axes extending in the first direction, respectively, and a torsional in-phase mode in which the pair of resonating arms is twisted in the same phase around the axes extending in the first direction, respectively.

In this configuration, since the resonation of a portion other than the resonating arm is reduced, a resonator having low resonation leakage is obtained.

In the resonator of the aspect of the invention, it is preferable that the main resonation is the second-direction reversed-phase mode.

In this configuration, it is possible to realize a high Q value, and thus the resonator element has a low CI value.

In the resonator of the aspect of the invention, it is preferable that the resonating arm has a groove that is open on a main plane, in which, when the resonating arm has a length of L [m] in the first direction, at least a part of the groove is provided between a base end of the resonating arm and a position separated from the base end to a tip end side by L/3, and, when the resonating arm has a length of W [m] in a resonating direction of the main resonation, a relationship of $W > W_0$ is satisfied. Here, $$W_0 = \sqrt{\frac{\pi k}{2\rho C_p f_1}},$$

when ρ [kg/m³] represents a mass density of the resonating arm, Cp [J/(kg·K)] represents heat capacity of the resonating arm, and k [W/(m·K)] represents thermal conductivity of the resonating arm in the resonating direction of the main resonation.

In this configuration, it is possible to reduce a decrease in a Q value.

In the resonator of the aspect of the invention, it is preferable that, when the resonating arm has a length of W [m] in the resonating direction of the main resonation, a relationship of W<$W_0$ is satisfied, provided that, $$W_0 = \sqrt{\frac{\pi k}{2\rho C_p f_1}},$$

when ρ [kg/m³] represents a mass density of the resonating arm, Cp [J/(kg·K)] represents heat capacity of the resonating arm, and k [W/(m·K)] represents thermal conductivity of the resonating arm in the resonating direction of the main resonation.

In this configuration, it is possible to reduce the decrease in the Q value.

In the resonator of the aspect of the invention, it is preferable that, when a Q value of the resonator element is Q, a relationship of $$Q \geq \frac{\rho C_p}{c\alpha^2 \theta} \times \frac{1 + \left(\frac{f_1}{f0_{max}}\right)^2}{\frac{f_1}{f0_{max}}}$$

is satisfied, provided that, $$f0_{max} = \frac{\pi k}{2\rho C_p W_{emin}^2}$$

and $W_{emin}$=C(AL+B), when A=7.3690×10⁻², B=1.2544× 10⁻⁵, C=1.1 to 1.3, ρ [kg/m³] represents a mass density of the resonating arm, Cp [J/(kg·K)] represents heat capacity of the resonating arm, c [N/m²] represents an elastic constant related to an extending direction of the resonating arm, α [1/K] represents a coefficient of thermal expansion related to the extending direction of the resonating arm, Θ [K] represents ambient temperature, k [W/(m·K)] represents thermal conductivity of the resonating arm in the resonating direction of the main resonation, and π represents a ratio of the circumference of a circle to the diameter.

In this configuration, a resonator element having a small size but having a high Q value is obtained.

In the resonator of the aspect of the invention, it is preferable that the main resonation is the third-direction reversed-phase mode.

In this configuration, it is possible to realize a high Q value, and thus the resonator element has a low CI value.

In the resonator of the aspect of the invention, it is preferable that the inherent resonation modes include modes of flexural resonations of the resonating arm in a direction orthogonal to the resonating direction of the main resonation.

In this configuration, since such a mode is likely to be coupled with the main resonation, effects of the invention increase.

An oscillator according to another aspect of the invention includes: the resonator according to the aspects of the invention; and an oscillation circuit.

In this configuration, it is possible to obtain a highly reliable oscillator.

An electronic apparatus according to still another aspect of the invention includes: the resonator according to the aspects of the invention.

In this configuration, it is possible to obtain a highly reliable electronic apparatus.

A vehicle according to yet another aspect of the invention includes: the resonator according to the aspects of the invention.

In this configuration, it is possible to obtain a highly reliable vehicle.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a resonator, an oscillator, an electronic apparatus, and a vehicle according to the invention will be described in detail on the basis of exemplary embodiments illustrated in the figures.

First Embodiment

First, a resonator according to a first embodiment of the invention is described.

Figure 1:
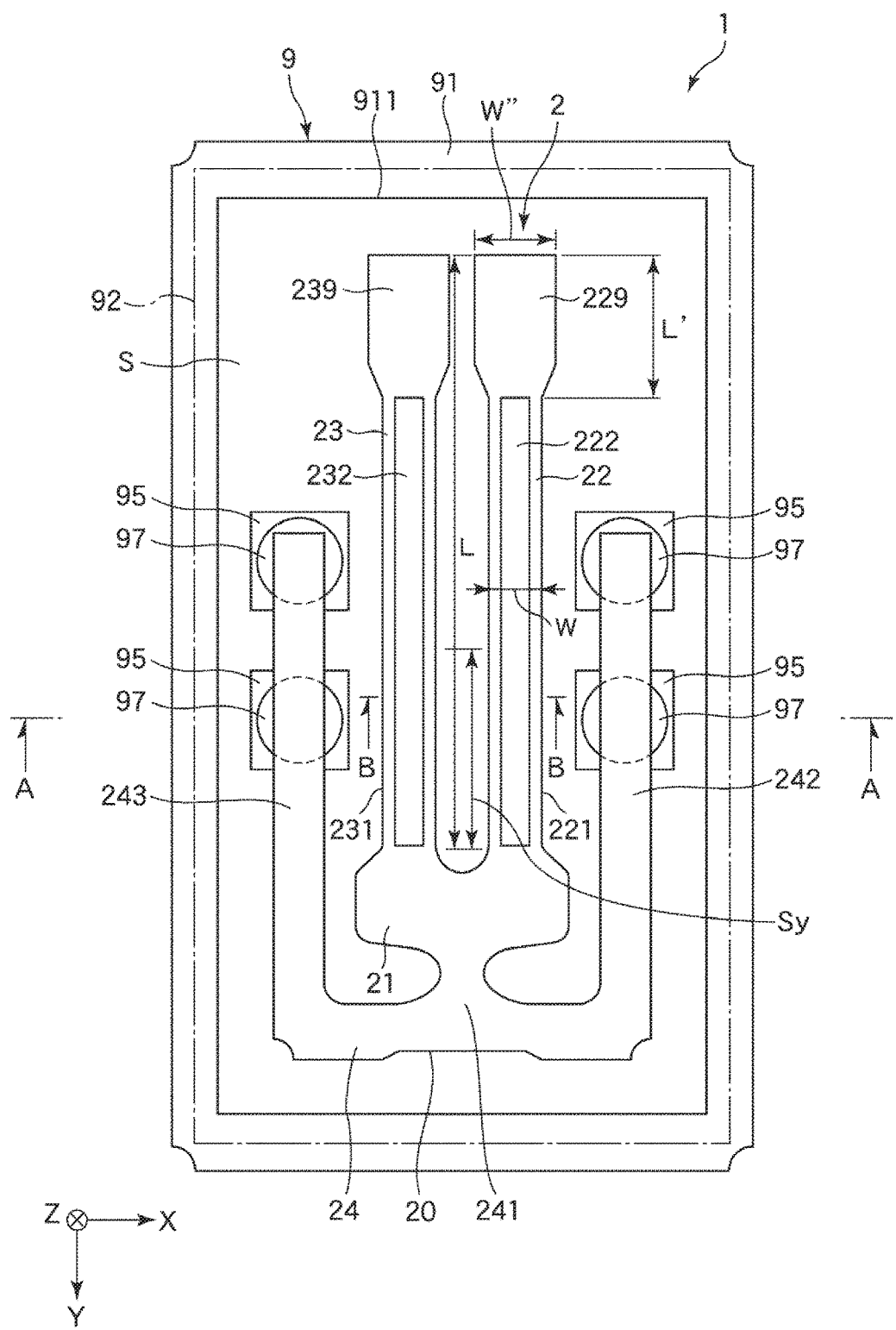
FIG. 1 is a plan view illustrating a resonator according to a first embodiment of the invention.
Figure 2:
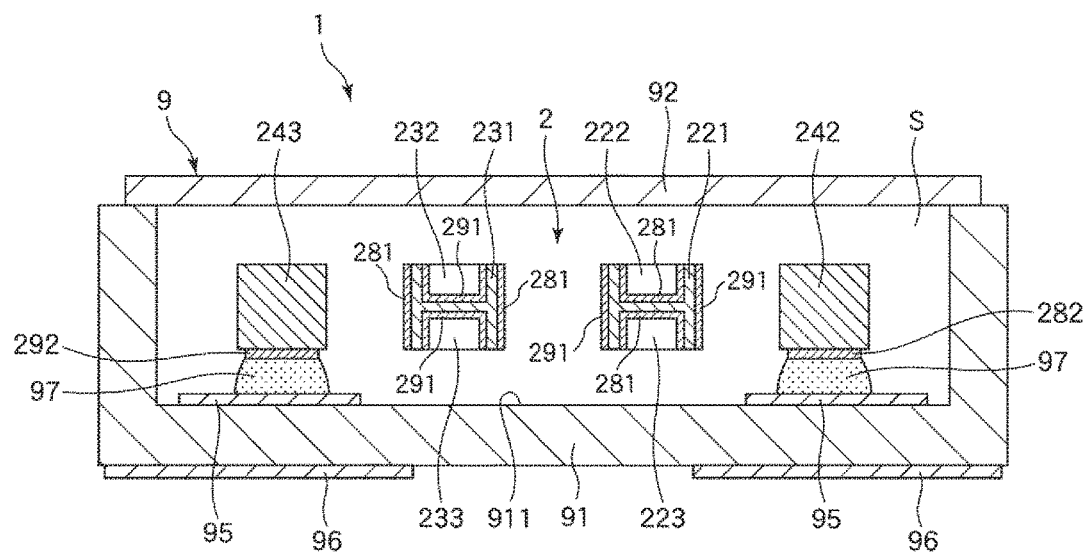
FIG. 2 is a sectional view taken along line A-A in FIG. 1.
Figure 3:
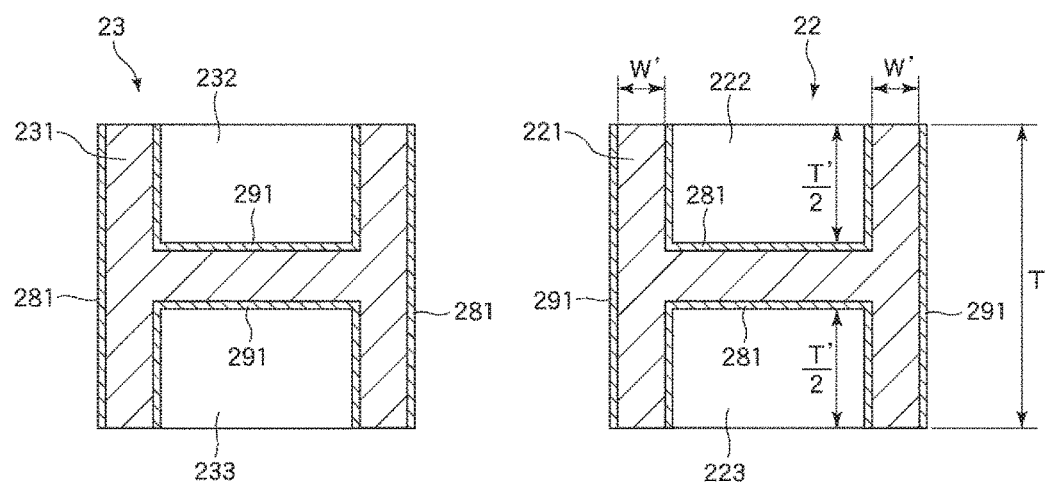
FIG. 3 is a sectional view taken along line B-B in FIG. 1.
Figure 4:
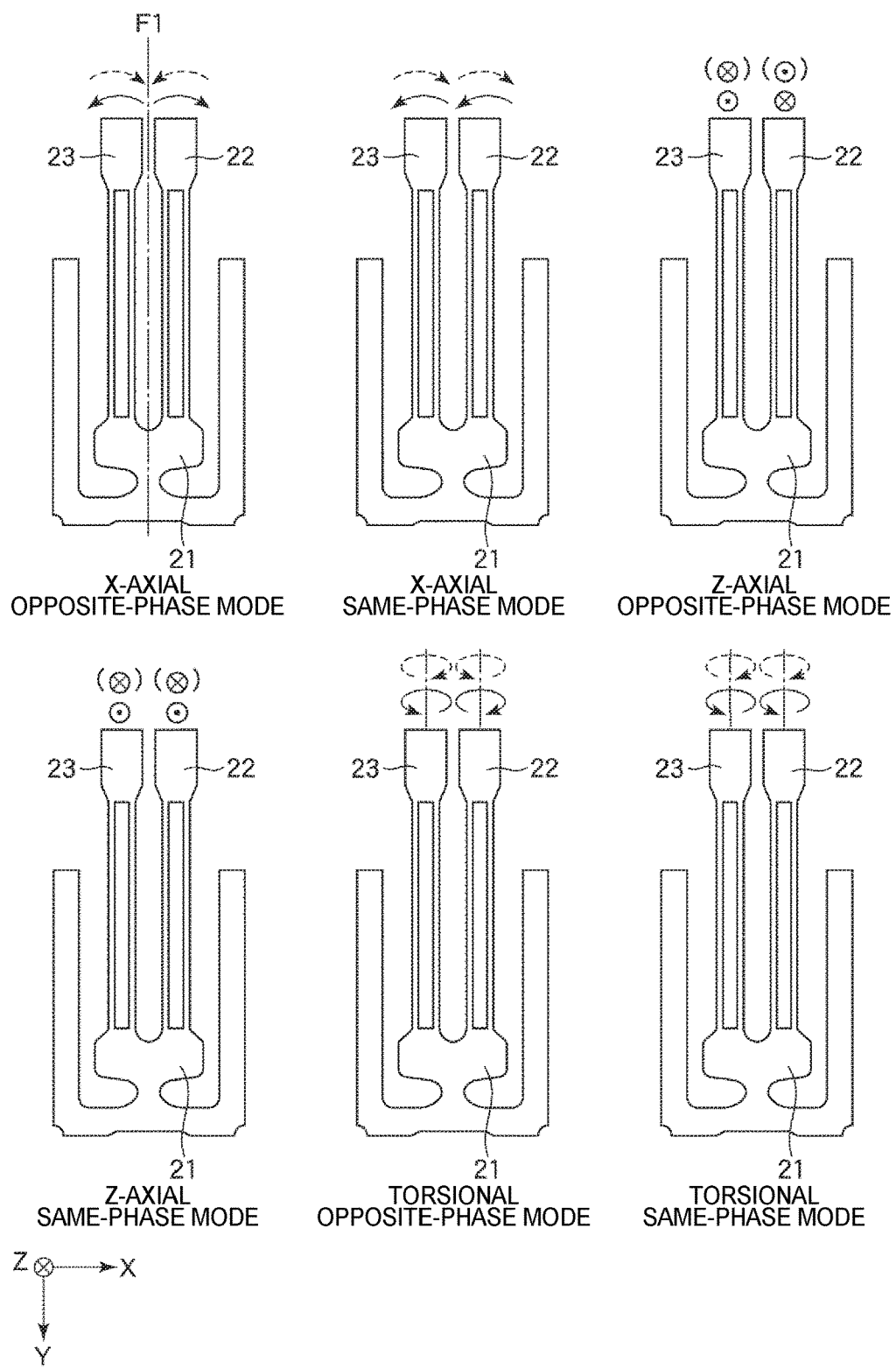
FIG. 4 is a plan view illustrating inherent resonation modes of a resonator element.
Figure 5:
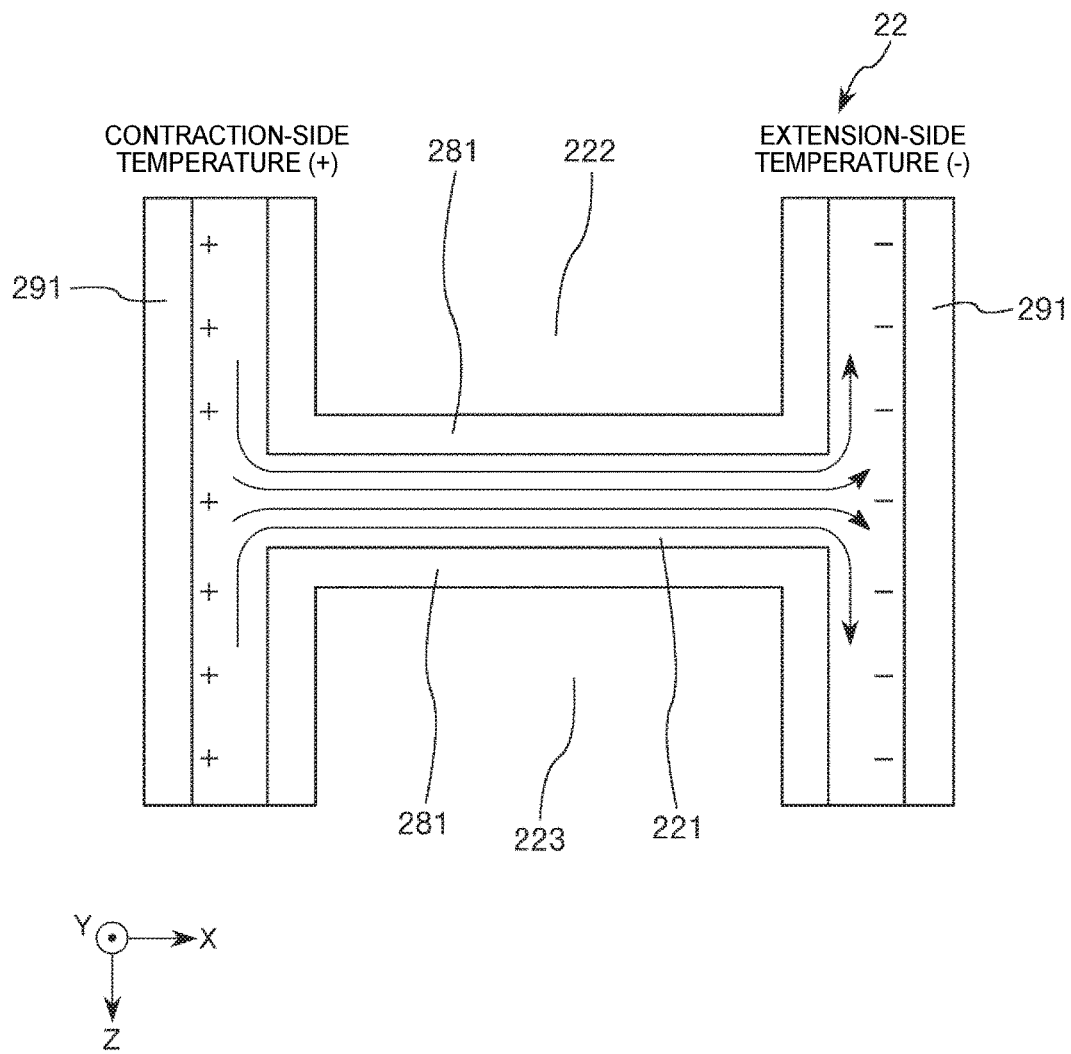
FIG. 5 is a sectional view of a resonating arm illustrating thermal conduction during flexural resonation.
Figure 6:
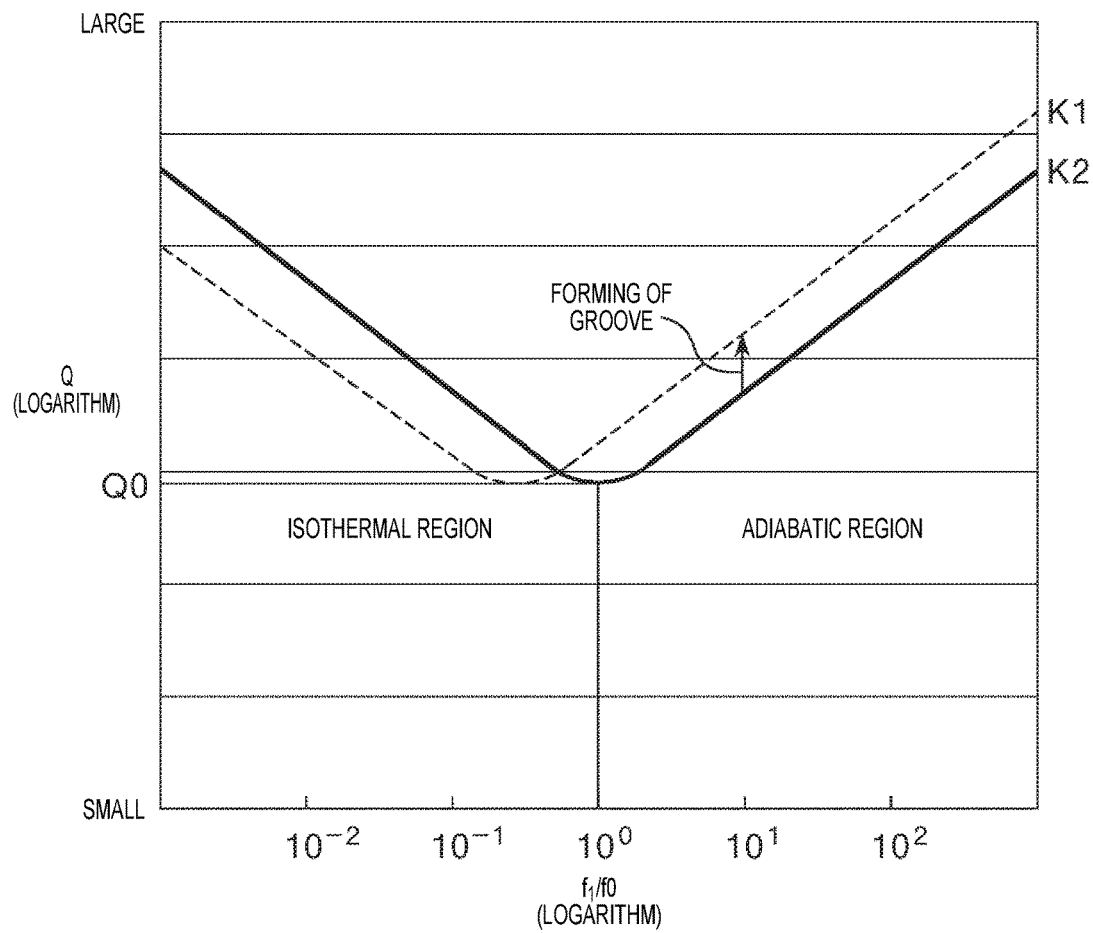
FIG. 6 is a graph illustrating a relationship between a Q value and $f_1$/f0.
Figure 7:
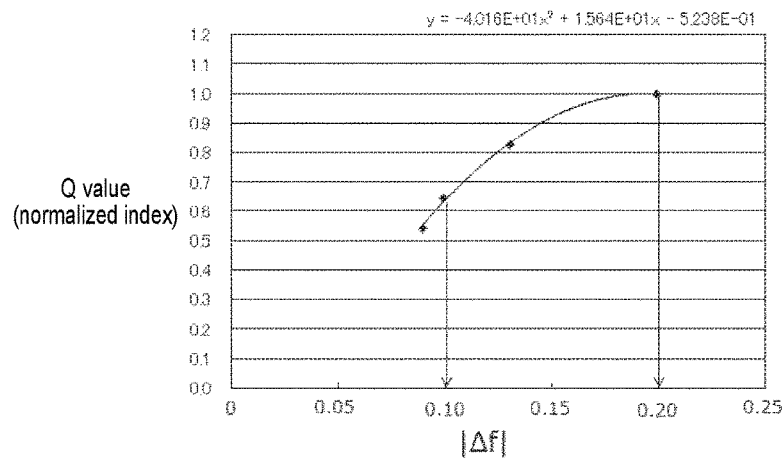
FIG. 7 is a graph illustrating a relationship between Δf and the Q value.
Figure 8:
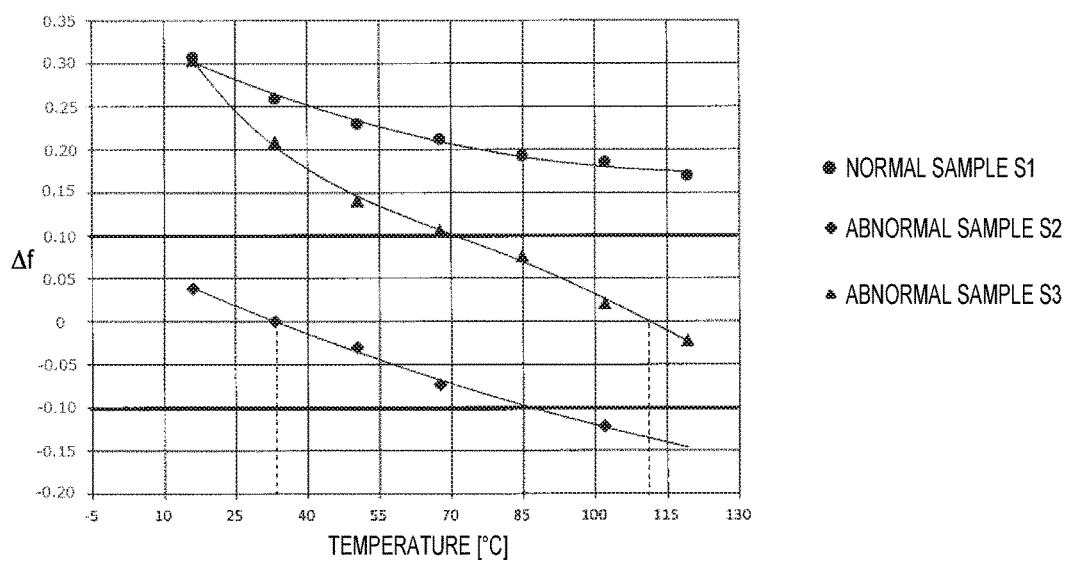
FIG. 8 is a graph illustrating a relationship between Δf and a temperature.
Figure 9:
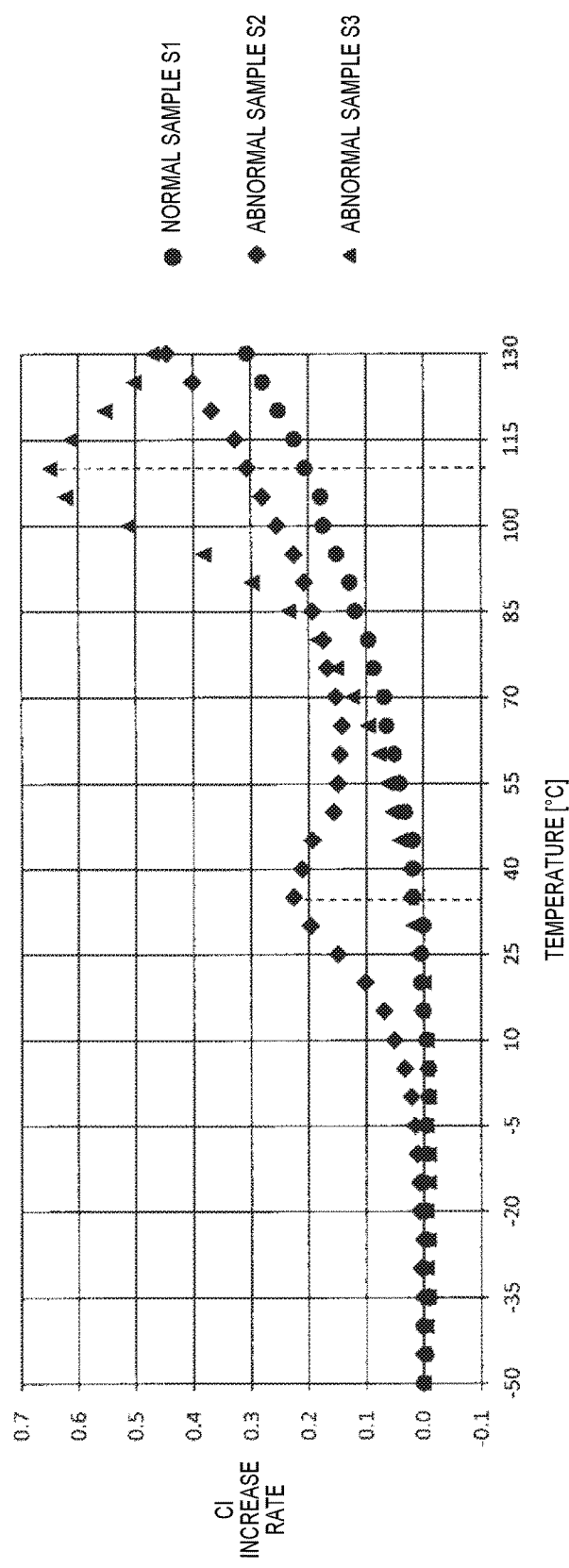
FIG. 9 is a graph illustrating a relationship between a CI increase rate and a temperature.
Figure 10:
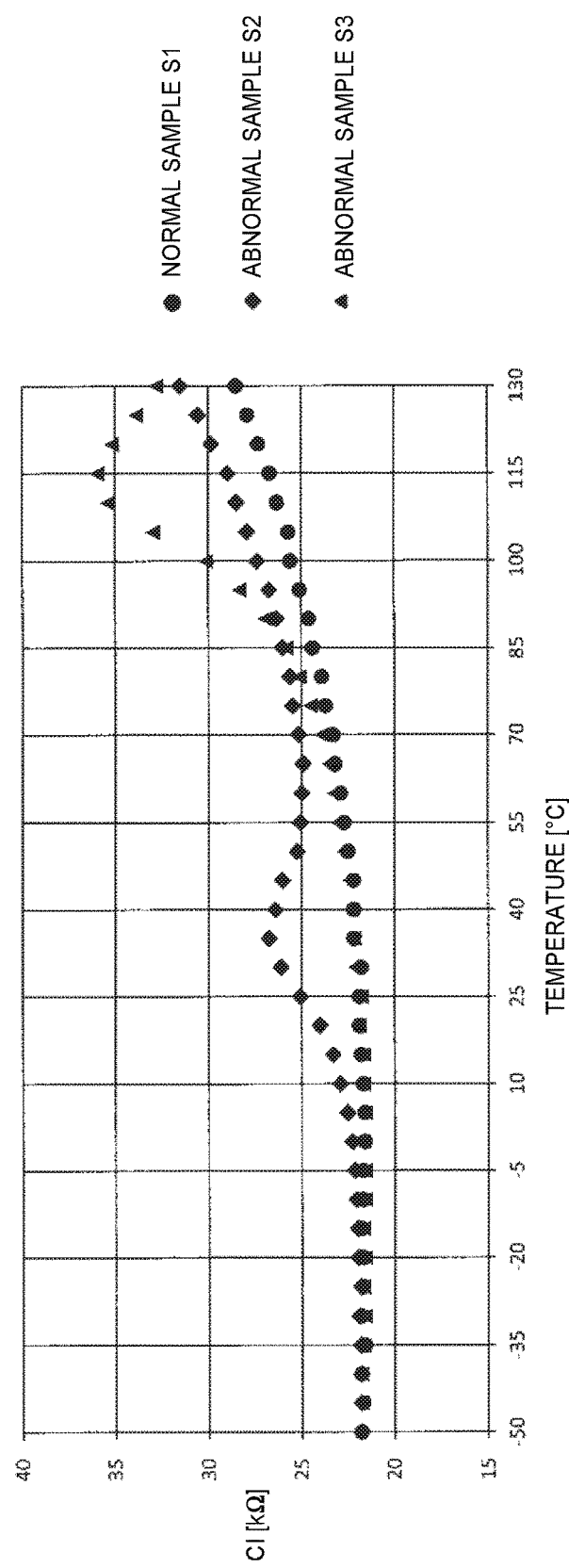
FIG. 10 is a graph illustrating a relationship between CI and a temperature.
Figure 11:
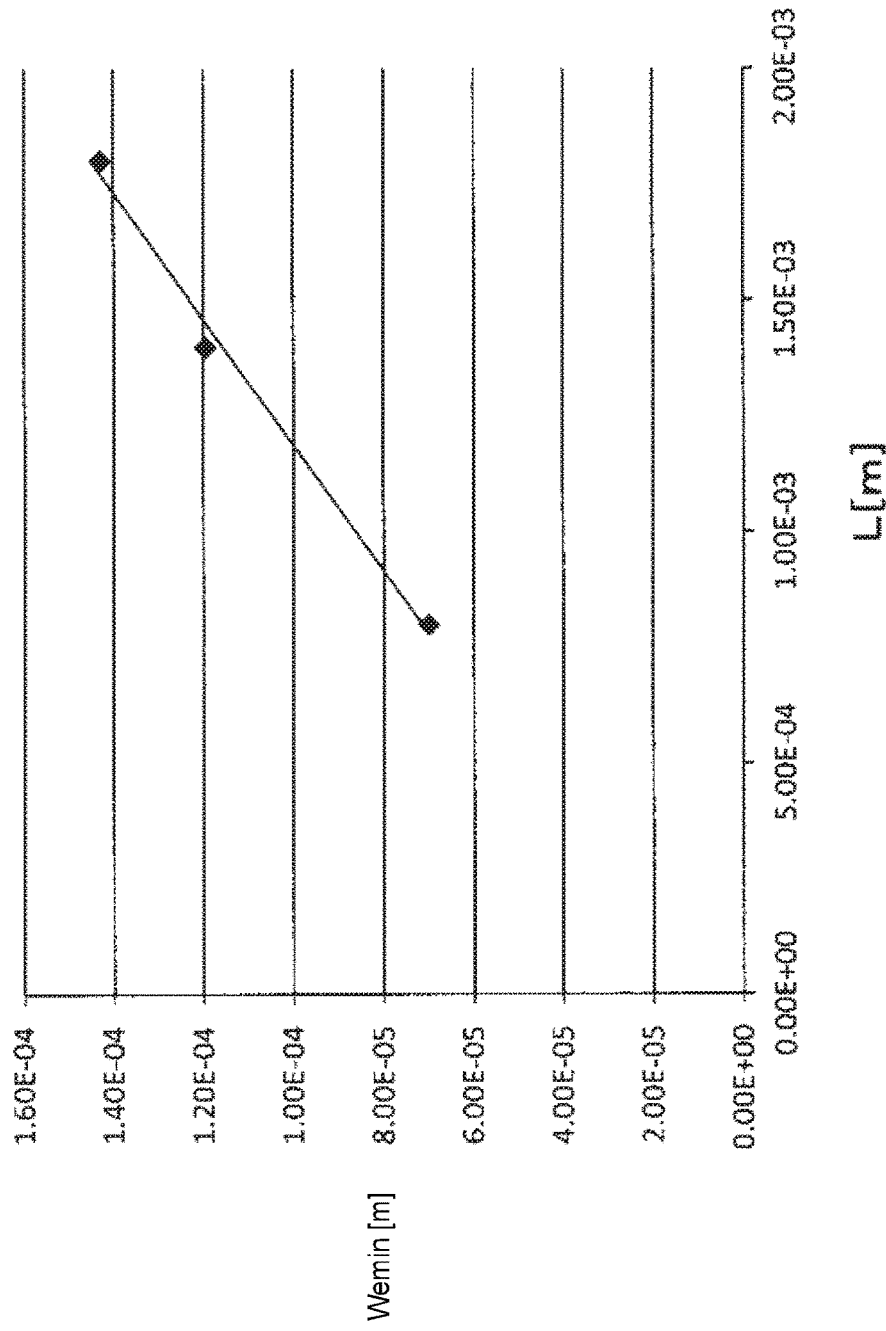
FIG. 11 is a graph illustrating a relationship between the length of the resonating arm and the width of the resonating arm.
Figure 12:
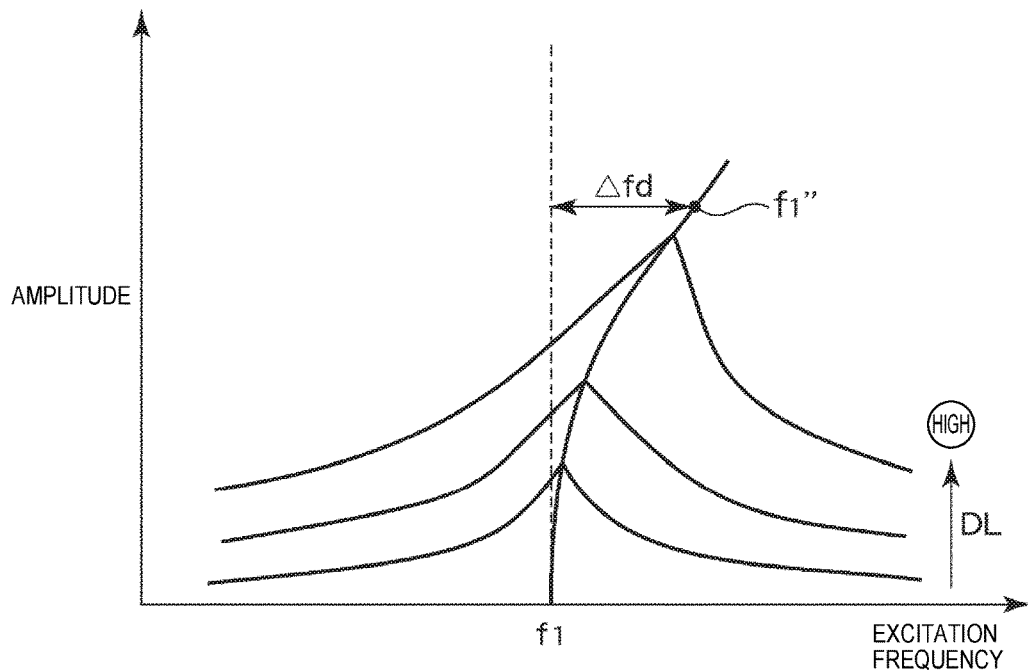
FIG. 12 is a graph illustrating a relationship between amplitude of the resonating arm and a resonance frequency of main resonation in a nonlinear resonation system.
Figure 13:
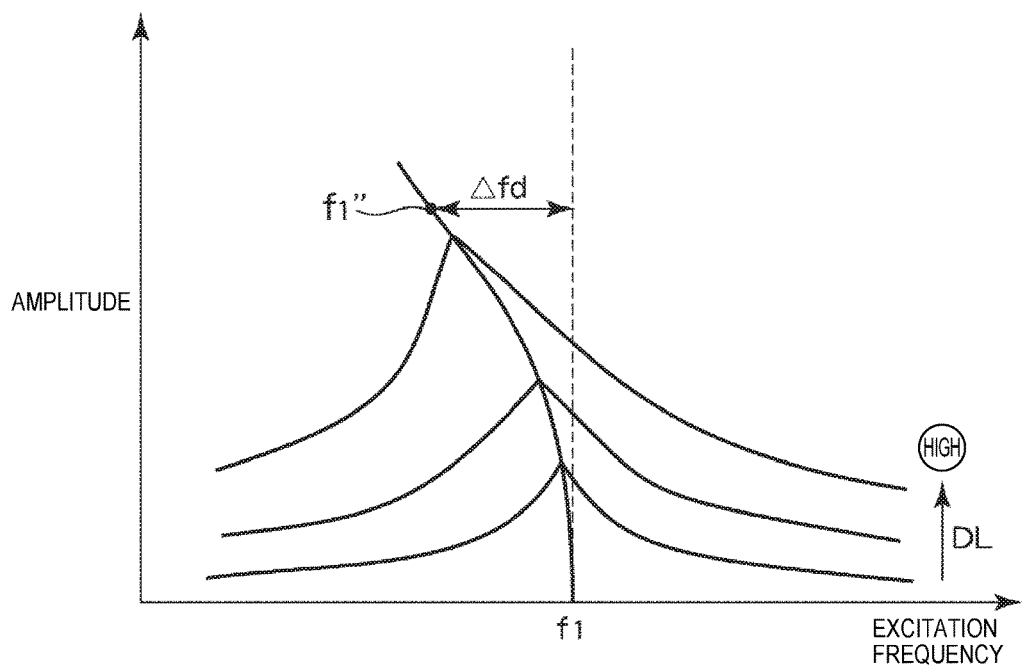
FIG. 13 is a graph illustrating another relationship between amplitude of the resonating arm and a resonance frequency of main resonation in the nonlinear resonation system.
Figure 14:
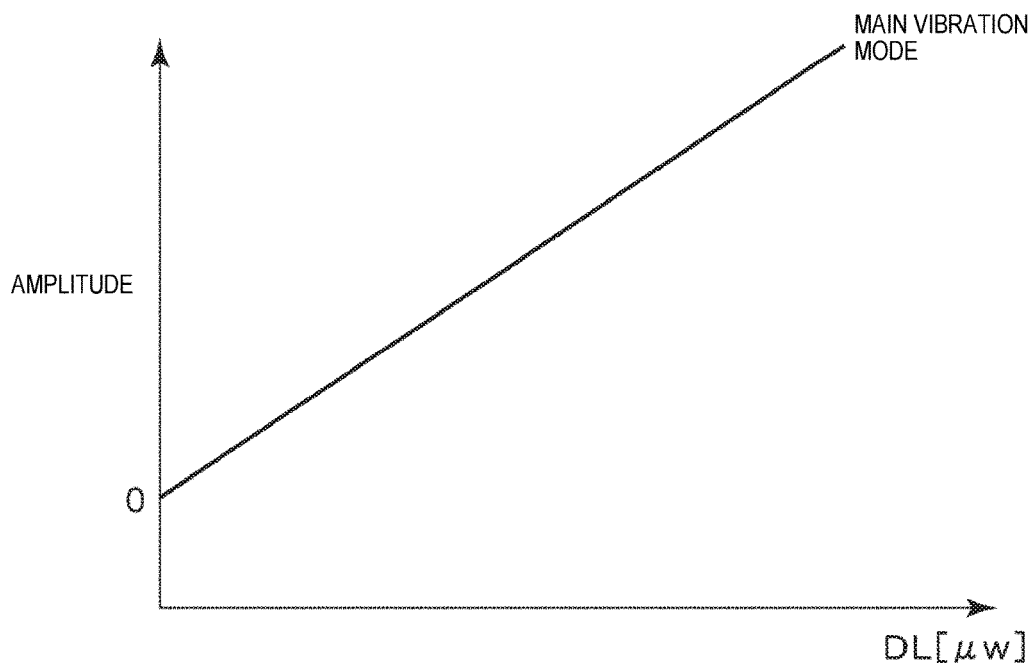
FIG. 14 is a graph illustrating a relationship between excitation power DL and the amplitude of the resonating arm in a case where an internal resonance does not occur in the resonator element.
Figure 15:
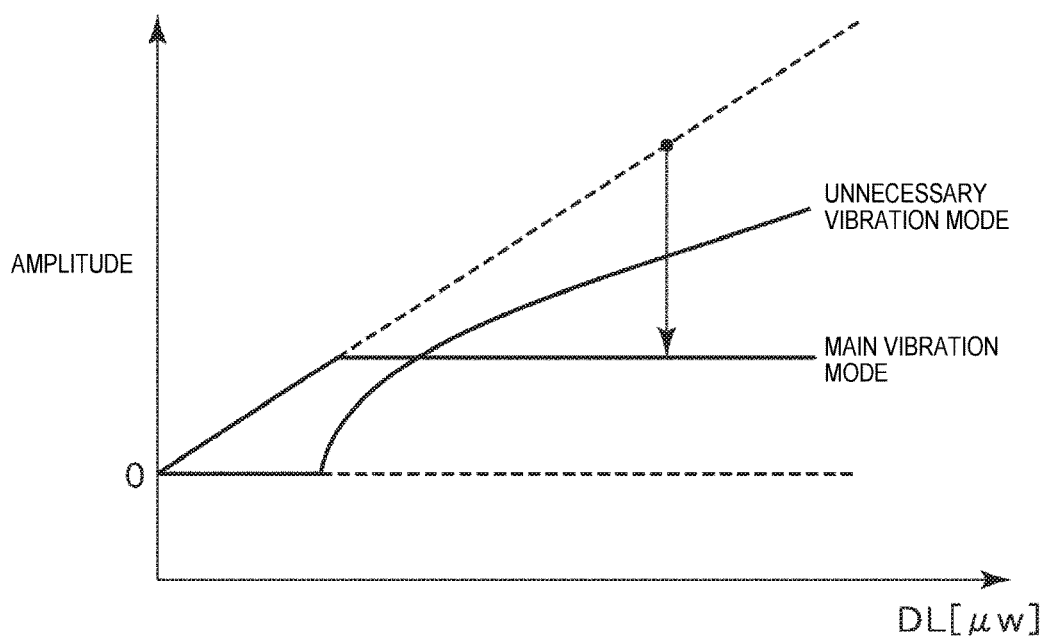
FIG. 15 is a graph illustrating another relationship between the excitation power DL and the amplitude of the resonating arm in a case where an internal resonance occurs in the resonator element.
Figure 16:
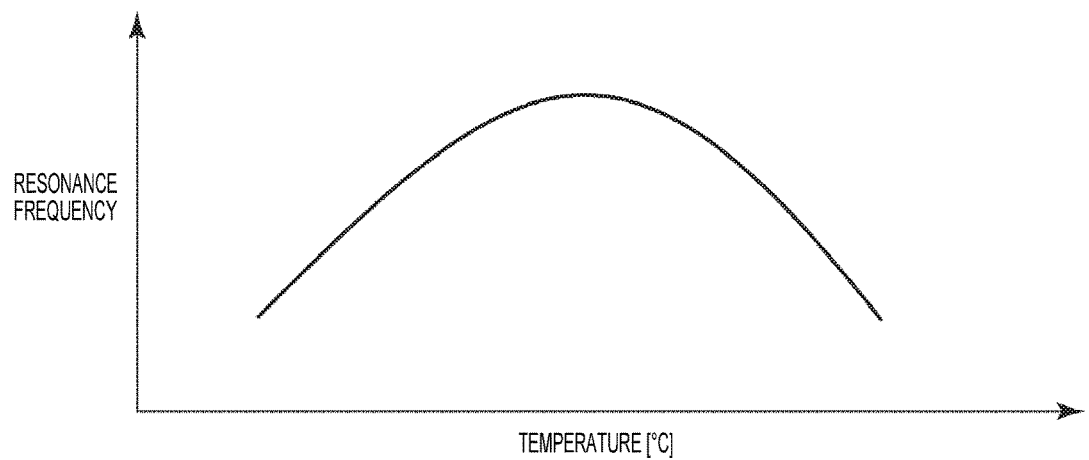
FIG. 16 is a graph illustrating frequency-temperature characteristics in the case where an internal resonance does not occur in the resonator element.
Figure 17:
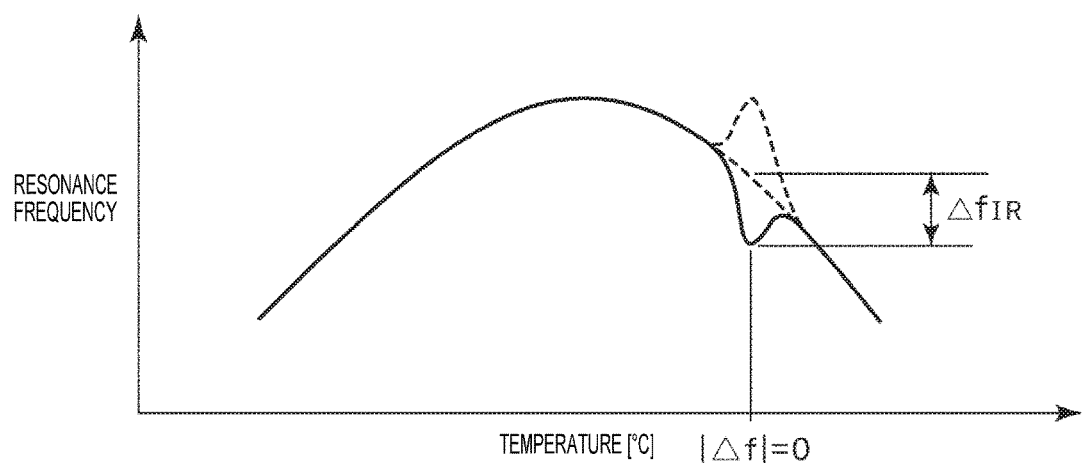
FIG. 17 is a graph illustrating frequency-temperature characteristics in the case where an internal resonance occurs in the resonator element.
Figure 18:
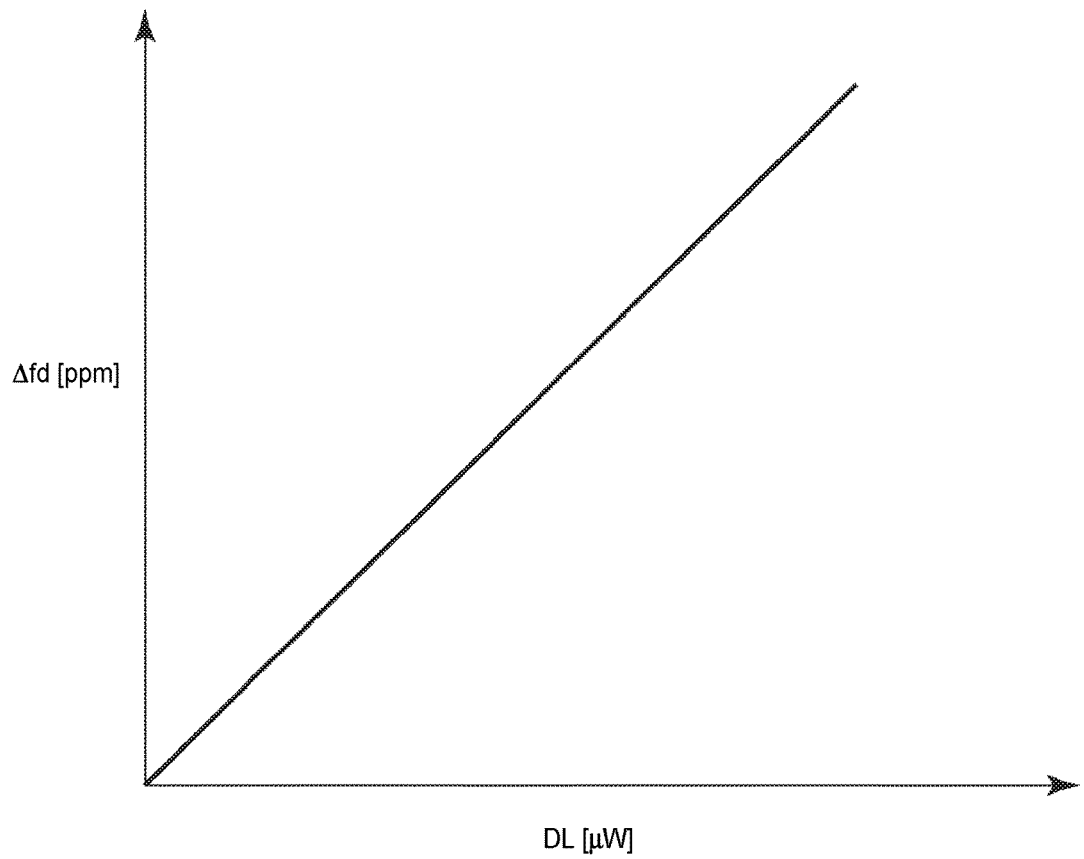
FIG. 18 is a graph illustrating a relationship between the excitation power DL and Δfd.

FIG. 1 is a plan view illustrating the resonator according to the first embodiment of the invention. FIG. 2 is a sectional view taken along line A-A in FIG. 1. FIG. 3 is a sectional view taken along line B-B in FIG. 1. FIG. 4 is a plan view illustrating inherent resonation modes of a resonator element. FIG. 5 is a sectional view of a resonating arm illustrating thermal conduction during flexural resonation. FIG. 6 is a graph illustrating a relationship between a Q value and $f_1/f0$. FIG. 7 is a graph illustrating a relationship between Δf and the Q value. FIG. 8 is a graph illustrating a relationship between Δf and a temperature. FIG. 9 is a graph illustrating a relationship between a CI increase rate and a temperature. FIG. 10 is a graph illustrating a relationship between CI and a temperature. FIG. 11 is a graph illustrating a relationship between the length of the resonating arm and the width of the resonating arm. FIGS. 12 and 13 are graphs illustrating relationships between amplitude of the resonating arm and a resonance frequency of main resonation in the nonlinear resonation system. FIG. 14 is a graph illustrating a relationship between excitation power DL and the amplitude of the resonating arm in a case where an internal resonance does not occur in the resonator element. FIG. 15 is a graph illustrating another relationship between the excitation power DL and the amplitude of the resonating arm in a case where an internal resonance occurs in the resonator element. FIG. 16 is a graph illustrating frequency-temperature characteristics in the case where an internal resonance does not occur in the resonator element. FIG. 17 is a graph illustrating frequency-temperature characteristics in the case where an internal resonance occurs in the resonator element. FIG. 18 is a graph illustrating a relationship between the excitation power DL and Δfd.

Note that, in the figures, an X axis, a Y axis, and a Z axis are appropriately illustrated as three axes orthogonal to each other, and the X axis, the Y axis, and the Z axis correspond to an X axis (electrical axis), a Y axis (machine axis), and a Z axis (optical axis) which are crystal axes of a quartz crystal. In addition, in the following description, a direction (second direction) parallel to the X axis is referred to as the "X-axial direction", a direction (first direction) parallel to the Y axis is referred to as the "Y-axial direction", and a direction (third direction) parallel to the Z axis is referred to as the "Z-axial direction". In addition, arrows represent the X axis, the Y axis, and the Z axis, respectively, in the figures, in which tip sides of the arrows are referred to as "+ (plus)" and base end sides are referred to as "− (minus)". In addition, a −Z-axial direction side is referred to as an "upper side", and a +Z-axial direction side is referred to as a "lower side". In addition, in the following description, a planar view obtained when viewed in the Z-axial direction is also simply referred to as "a plan view".

As illustrated in FIG. 1, a resonator 1 includes a package 9 and a resonator element 2 that is accommodated in the package 9. Hereinafter, such a resonator 1 is described in detail.

Package

As illustrated in FIGS. 1 and 2, the package 9 has a recessed portion 911 that is open on the top plane, and includes a box-shaped base 91, in which the resonator element 2 is attached to a bottom surface of the recessed portion 911, and a plate-like lid 92 that bonded to the base 91 so as to cover the opening of the recessed portion 911. The package 9 has an airtight accommodation space S formed by covering the recessed portion 911 with the lid 92, and the resonator element 2 is accommodated in the accommodation space S. Note that it is preferable that the accommodation space S has a state of pressure reduction (preferably, vacuum). In this manner, viscosity resistance decreases, and thus the resonator element 2 is improved in resonation characteristics.

In addition, a plurality of internal terminals 95 are disposed on the bottom surface of the recessed portion 911. In addition, a plurality of external terminals 96 are disposed on the bottom surface of the base 91. The corresponding internal terminals 95 and external terminals 96 are electrically connected, respectively, via internal wiring (not illustrated) which is disposed in the base 91. In addition, a conductive adhesive 97 (holding member) is disposed on the internal terminal 95, and the resonator element 2 is held to the base 91 via the conductive adhesive 97 and is electrically connected to the internal terminal 95.

Resonator Element

As illustrated in FIG. 1, the resonator element 2 includes a resonating body 20 and an electrode that is disposed on the resonating body 20. Note that the electrode is omitted in FIG. 1, for convenience of description.

The resonating body 20 is formed of a Z cut quartz crystal plate through patterning using a photolithography method and an etching method (particularly, a wet etching method). Note that the Z cut quartz crystal plate is a quartz crystal substrate having, as a thickness direction, the Z axis (optical axis) which is the crystal axis of the quartz crystal. It is preferable that the Z axis is coincident with the thickness direction of the resonating body 20; however, regarding reduction in a change in frequency and temperature at an approximate room temperature, the Z axis may be inclined slightly (for example, in a range of −5° to +15°) with respect to the thickness direction.

As illustrated in FIG. 1, the resonating body 20 includes a base portion 21, a pair of resonating arms 22 and 23 that extends from the base portion 21 in a −Y-axial direction, and a support 24 that is connected to the base portion 21.

The base portion 21 has a plate shape which is widened along an XY plane with the Z-axial direction as the thickness direction. In addition, the resonating arms 22 and 23 are aligned in the X-axial direction and extend from the base portion 21 in the −Y-axial direction so as to be parallel to each other. In addition, the resonating arms 22 and 23 include arm portions 221 and 231 that have a width (length in the X-axial direction) which is substantially constant in an extending direction, and wide portions 229 and 239 which are disposed on the tip end side of the arm portions 221 and 231 and have a width wider than the arm portions 221 and 231. In addition, the support 24 includes a connection portion 241 that is connected to an end portion of the base portion 21 on a +Y axis side and a pair of support arms 242 and 243 that extends in the −Y-axial direction from both sides of the connection portion 241 in the X-axial direction. The resonating arms 22 and 23 are positioned to be interposed between the pair of support arms 242 and 243.

In addition, as illustrated in FIGS. 2 and 3, the arm portion 221 is provided with a bottomed groove 222 which is open on the top plane of the arm portion (a main surface on a −Z axis side) and a bottomed groove 223 which is open on the underside of the arm portion (a main surface on a +Z axis side). Similarly, the arm portion 231 is provided with a bottomed groove 232 which is open on the top plane of the arm portion and a bottomed groove 233 which is open on the underside of the arm portion. As described above, the arm portion 221 is provided with the grooves 222 and 223, and the arm portion 231 is provided with the grooves 232 and 233. In this manner, as will be described below, a transfer path of heat produced from flexural resonation increases, and thus it is possible to reduce a thermoelastic loss in an adiabatic region such that it is possible to increase a Q value of the resonator element 2.

The electrode includes first drive electrodes 281 and a first drive terminal 282 and second drive electrodes 291 and a second drive terminal 292. As illustrated in FIG. 3, the first drive electrodes 281 are disposed on both upper and lower surfaces (inner surfaces of the grooves 222 and 223) of the resonating arm 22 and on both side surfaces of the resonating arm 23, and the second drive electrodes 291 are disposed on both side surfaces of the resonating arm 22 and on both upper and lower surfaces (inner surfaces of the grooves 232 and 233) of the resonating arm 23. In addition, as illustrated in FIG. 2, the first drive terminal 282 is disposed under the support arm 242 and is electrically connected to the first drive electrode 281 via wiring (not illustrated). On the other hand, the second drive terminal 292 is disposed under the support arm 243 and is electrically connected to the second drive electrode 291 via wiring (not illustrated). In addition, the first and second drive terminals 282 and 292 are in contact with the conductive adhesives 97.

In the resonator element 2, when a drive signal (for example, an alternating voltage having substantially the same frequency as the resonance frequency of the main resonation) is applied between the first drive electrode 281 and the second drive electrode 291, the resonating arms 22 and 23 flexurally resonate in reversed-phases (so as to repeat approaching each other and separation from each other) in the X-axial direction, as illustrated in a view on the upper left side in FIG. 4. This resonation mode is referred to as an "X-axial reversed-phase mode (second-direction reversed-phase mode)" and is an inherent resonation mode as the main resonation of the resonator element 2. As described above, the X-axial reversed-phase mode is the main resonation, and thereby resonations of the resonating arms 22 and 23 are canceled such that resonation leakage to the base portion 21 is reduced. Therefore, it is possible to realize a high Q value, and thus the resonator element 2 has a low CI value. Note that the "main resonation" means the inherent resonation mode in the resonator element 2 in which electrically direct drive is performed.

In addition, as illustrated in FIG. 4, the resonator element 2 has one virtual-resonation symmetry plane f1 (YZ plane) as a symmetry plane in the X-axial reversed-phase mode as the main resonations of the resonating arms 22 and 23. Therefore, the resonations of the resonating arms 22 and 23 are canceled, and thus resonation energy is unlikely to leak to the base portion 21. Hence, it is possible to reduce a decrease in the Q value. Note that, actually, the resonator element 2 also resonates in a state in which the X-axial reversed-phase mode as the main resonation is coupled with a Z-axial reversed-phase mode, a torsional reversed-phase mode, or the like as unnecessary resonation in some cases; however, the virtual-resonation symmetry plane f1 described above is a target surface obtained in a case where the suprious modes are removed and only the main resonation is considered. Note that the suprious modes will be described below in detail.

Here, there is no particular limitation on a resonance frequency $f_1$ of the main resonation (X-axial reversed-phase mode); however, for example, a range of the resonance frequency is preferably $1 \times 10^3$ [Hz] to $1 \times 10^6$ [Hz], and more preferably, $2^m$ times 31.768 [kHz] to 33.768 [kHz], that is, $(32.768 \pm 1.0) \times 2^m$ [kHz]. Here, m is an integer of −1 to 4. The resonance frequency $f_1$ is set to such a frequency, it is possible to obtain the resonator element 2 having high convenience.

As described above, a configuration of the resonator element 2 is described in brief. Next, the "thermoelastic loss" described above will be described in brief with the resonating arm 22 as an example. As described above, when the resonating arm 22 flexurally resonates in the X-axial direction, one side surface of the arm portion 221 contracts if the other side surface extends, and, conversely, one side surface extends if the other surface contracts. In a case where the resonating arm 22 does not produce a Gough-Joule effect (energy elasticity is stronger than entropic elasticity), as illustrated in FIG. 5, temperature rises on the contracting side surface side and temperature is lowered on the extending side surface side. Therefore, a temperature difference occurs between both side surfaces, that is, in an inner side of the arm portion 221. A loss of resonation energy occurs with transfer of heat (refer to arrows in FIG. 5) due to the temperature difference, and thereby the Q value of the resonator element 2 decreases. The decrease in the Q value is also referred to as a thermoelastic effect, and a loss in the energy due to the thermoelastic effect is referred to as a "thermoelastic loss".

In the resonator element that resonates in a flexural resonation mode as the resonator element 2, the resonance frequency $f_1$ (mechanical flexural resonation frequency) of the main resonation of the resonating arm 22 is equal to a thermal-relaxation frequency f0 and is set to the minimum Q value (Q0). Note that the thermal-relaxation frequency f0 can be obtained from $f0=1/(2\pi\tau)$ (here, in the expression, $\pi$ represents a ratio of the circumference of a circle to the diameter, $\tau$ represents relaxation time taken for the temperature difference to decrease as much as $e^{-1}$ times the temperature difference due to thermal conduction when e is an exponential).

As described above, the resonating arm 22 is provided with the grooves 222 and 223 which are disposed to be positioned between both of the side surfaces. Therefore, the transfer path of the heat, through which temperature equilibrium of the temperature difference on both of the side surfaces that occurs during the flexural resonation of the resonating arm 22 is performed, is formed to take a detour around the grooves 222 and 223, and the transfer path of the heat is longer than a distance in a straight line between both of the side surfaces (shortest distance). Hence, the relaxation time $\tau$ is prolonged, compared to a case where the resonating arm 22 is not provided with the grooves 222 and 223, and the thermal-relaxation frequency f0 of the resonating arm 22 that is provided with the grooves 222 and 223 is lower than the thermal-relaxation frequency f0 of the resonating arm 22 that is not provided with the grooves 222 and 223.

FIG. 6 illustrates a graph representing dependence of the Q value of the resonator element on $f_1/f0$ in the flexural resonation mode. A region in which $f_1/f0<1$ in FIG. 6 is referred to as an "isothermal region". $f_1/f0$ decreases, and thus the Q value increases in this isothermal region. This is because the temperature difference in the resonating arm as described above is unlikely to occur as the resonance frequency $f_1$ (mechanical frequency of the resonating arm) of the main resonation decreases (resonations of the resonating arm are delayed). Hence, in the limit reached when $f_1/f0$ approaches 0 (zero) without limit, an isothermal quasi-static operation is performed, and the thermoelastic loss approaches 0 (zero) without limit. On the other hand, a region in which $f_1/f0<1$ in FIG. 6 is referred to as a "adiabatic region". $f_1/f0$ increases, and thus the Q value increases in this adiabatic region. This is because switching between a temperature increase a temperature effect on the side surfaces is performed in a high speed such that there is no time for the thermal conduction (transfer of heat) as described above, as the resonance frequency $f_1$ of the main resonation increases. Hence, in the limit reached when $f_1/f0$ increases without limit, an adiabatic operation is performed, and the thermoelastic loss approaches 0 (zero) without limit. The resonator element 2 of the embodiment is in the adiabatic region.

In addition, in FIG. 6, a curve K1 as a dashed line represents the case the grooves are formed in the resonating arm of the resonator element 2, and a curve K2 as a solid line represents the case the grooves are not formed in the resonating arm. The shapes of the curves K1 and K2 are unlikely to change; however, the curve K1 shifts with respect to the curve $K_2$ in a frequency decreasing direction, as the thermal-relaxation frequency f0 as described above decreases. Hence, in the adiabatic region, the Q value of the resonator element having the resonating arm, in which the grooves are formed, increases with respect to the Q value of the resonator element having the resonating arm, in which the grooves are not formed. Accordingly, as described above, the resonator element 2 of the embodiment can realize a high Q value. In addition, as clearly understood from FIG. 6, in a region in which $f_1/f0$ is smaller than that at a point at which the Q value of the resonator element that corresponds to the curve K1 is equal to the Q value of the resonator element that corresponds to the curve K2 in the isothermal region, that is, a point at which the curve K1 intersects with the curve K2, the Q value of the resonator element having the resonating arm, in which the grooves are formed, is smaller than the Q value of the resonator element having the resonating arm, in which the grooves are not formed, and thus it is preferable to form the grooves in the resonating arm.

Here, as illustrated in FIG. 1, when the resonating arm 22 has a length (length in the Y-axial direction) of L [m], at least a part of the grooves 222 and 223 is provided in a region Sy between a base end of the resonating arm 22 (a connection portion between the resonating arm 22 and the base portion 21) and a position separated by L/3 from the base end to the tip end side of the resonating arm 22. During the resonation, since the base end portion side of the resonating arm 22 is further deformed than a tip end portion, a significant temperature difference occurs in the resonating arm 22. Thus, the grooves 222 and 223 are disposed on the base end side of the resonating arm 22, and thereby it is possible to more increase the effects of the disposing of the grooves 222 and 223 (that is, the effects obtained in that it is possible to reduce the thermoelastic loss in the adiabatic region).

In addition, as described in FIG. 3, there is no particular limitation on a total T' of depths of the grooves 222 and 223; however, when the thickness of the resonating arm 22 is T, it is preferable to satisfy a relationship of 0.8 T≤T'<T. Such a relationship is satisfied, and thereby it is possible to more increase the transfer path of the heat described above, and it is possible to more increase the effects of the disposing of the grooves 222 and 223 (that is, the effects obtained in that it is possible to reduce the thermoelastic loss in the adiabatic region). Here, when the grooves 222 and 223 are formed through the wet etching, a crystal plane of the quartz crystal appears, and the grooves 222 and 223 does not have a rectangular cross-sectional shape as illustrated in FIG. 3; however, in this case, the "depth" is measured at the deepest portion of the grooves 222 and 223. The same is also true of the grooves 232 and 233 of the resonating arm 23.

In addition, as illustrated in FIG. 1, when the arm portion 221 of the resonating arm 22 (the same is also true of the resonating arm 23) has a width (length in the X-axial direction (resonating direction of the main resonation)) of W [m], it is preferable to satisfy the following Expression (1A), it is more preferable to satisfy the following Expression (1B), it is still more preferable to satisfy the following Expression (1C), and it is all the more preferable to satisfy the following Expression (1D).

$$W > W_0 \tag{1A}$$

$$W > 2W_0 \tag{1B}$$

$$W > 3W_0 \tag{1C}$$

$$W > 3.5W_0 \tag{1D}$$

Note that $W_0$ represents a virtual width (length in a direction in which the flexural resonation is performed) in a case where the resonating arm 22 has a rectangular cross-sectional shape. When $\rho$ [kg/m$^3$] represents a mass density of the resonating arm 22, Cp [J/(kg·K)] represents heat capacity of the resonating arm 22, k [W/(m·K)] represents thermal conductivity of the resonating arm 22 in the resonating direction (X-axial direction) of the main resonation, $\pi$ represents a ratio of the circumference of a circle to the diameter, and $f_1$ [Hz] represents the resonance frequency of the main resonation (the X-axial reversed-phase mode), $W_0$ is obtained from the following Expression (2).

$$W_0 = \sqrt{\frac{\pi k}{2\rho C_p f_1}} \tag{2}$$

Expression (1A) is satisfied as described above, the main resonation is the resonation in the adiabatic region, and, with the grooves 222 formed in the resonating arms 22 and 23, a decrease in the Q value due to the thermoelastic loss occurring during the flexural resonations of the resonating arms 22 and 23 is reduced. Further, Expressions (1B) to (1D) are satisfied, and thereby remarkable effects thereof are further achieved.

The thermoelastic loss is described above. Next, relationships between the plurality of inherent resonation modes of the resonator element 2, more specifically, relationships between the X-axial reversed-phase mode as the main resonation of the resonator element 2 and suprious modes other than the mode, will be described.

First, the suprious modes will be described. The resonator element 2 has, in addition to the main resonation (the X-axial reversed-phase mode) described above, suprious modes as the inherent resonation mode in which the resonator element is unstable with respect to the temperature and the resonation leakage does not set to be reduced, or it is difficult to reduce the resonation leakage. When the resonance frequency of the suprious mode has a relationship with the resonance frequency $f_1$ of the main resonation, which will be described below, the suprious mode is coupled with the main resonation and results in an internal resonance, and energy of the main resonation is likely to leak outside during the suprious mode. Therefore, the decrease in the Q value of the main resonation, an increase in CI value of the main resonation due to the decreases, further, unstable resonance frequency $f_1$ of the main resonation, or the like, resonation characteristics of the resonator element 2 are degraded.

There is no particular limitation on such suprious mode as long as the mode is an inherent resonation mode other than the main resonation, and an example of the mode includes a high-order mode of at least one inherent resonation mode of an X-axial in-phase mode (second-direction same-phase mode), a Z-axial reversed-phase mode (third-direction reversed-phase mode), a Z-axial same-phase mode (third-direction same-phase mode), a torsional reversed-phase mode, a torsional in-phase mode. The suprious modes have a low resonance frequency in a number of suprious modes, and further have a tendency to be easily coupled with the main resonation. Therefore, the resonator element has the modes as the unnecessary resonation, and thereby the remarkable effects of the invention, which will be described below, are achieved. Note that, in a case where the main resonation is not the X-axial reversed-phase mode, the X-axial reversed-phase mode may be included in the suprious modes.

In addition, it is preferable that the high-order mode described above includes at least one of secondary modes of the X-axial reversed-phase mode, the X-axial in-phase mode, the Z-axial reversed-phase mode, and the Z-axial same-phase mode, respectively. Since the suprious mode is likely to be easily coupled with the main resonation as the order is low, and the resonator element has the high-order modes as the suprious modes, and thereby the remarkable effects of the invention, which will be described below, are achieved.

Note that, as illustrated in FIG. 4, the X-axial in-phase mode is the inherent resonation mode in which the resonating arms 22 and 23 flexurally resonate in the same phase (in the same direction as each other) in the X-axial direction. In addition, the Z-axial reversed-phase mode is the inherent resonation mode in which the resonating arms 22 and 23 flexurally resonate in the reversed-phases in the Z-axial direction. In addition, the Z-axial same-phase mode is the inherent resonation mode in which the resonating arms 22 and 23 flexurally resonate in the same phase in the Z-axial direction. In addition, the torsional reversed-phase mode is the inherent resonation mode in which the resonating arms 22 and 23 are twisted in the reversed-phases around the axes of the arms (virtual center lines that are parallel to the Y-axial direction and pass through the centers of the cross sections of the resonating arms 22 and 23 in the X-axial direction and the Z-axial direction). In addition, the torsional in-phase mode is the inherent resonation mode in which the resonating arms 22 and 23 are twisted in the same phase around the axes thereof. Note that an arrow or "•" in "○" and "x" in "○" in FIG. 4 represent displacement directions of the resonating arm ("•" in "○" represents a front direction from the paper surface and "x" in "○" represents a rear direction from the paper surface), and a solid line and a dashed line, or parentheses indicate alternate repetition.

Next, a relationship between the resonance frequency of the main resonation (X-axial reversed-phase mode) and the resonance frequency of the suprious mode will be described.

When n is a natural number of 2 or greater, j is a natural number of 1 to n, the resonator element 2 performs resonation in n inherent resonation modes that have different resonance frequencies, respectively, that is, in the X-axial reversed-phase mode as the main resonation and at least one suprious mode. When $f_j$ is the resonance frequencies corresponding to n inherent resonation modes, respectively, and $k_j$ is an arbitrary integer (here, two or more of $k_j$ are not 0 ($\neq 0$), and $k_1 \neq 0$), a relationship between $f_j$ and $k_j$ is established. When, in this relationship, $f_1$ (that is, j=1) represents the resonance frequency of the main resonation of the resonator element 2 of the n inherent resonation modes, and a normalized frequency difference Δf is defined in the following Expression (3), the following Expression (4) is satisfied.

$$\Delta f \equiv \left( \frac{\sum_{j=2}^{n} k_j f_j}{-k_1} - f_1 \right) / f_1, \quad (3)$$

$$|\Delta f| \geq 0.03 \quad (4)$$

Further, the integer $k_j$ and the natural number n satisfy the following Expressions (5) and (6).

$$3 \leq \Sigma_{j=1}^{n} |k_j| \leq 10 \quad (5)$$

$$n \leq \Sigma_{j=1}^{n} |k_j| \quad (6)$$

The Expression (4) is satisfied, thereby the suprious mode is coupled with the main resonation and results in the internal resonance, and it is possible to reduce a possibility that the energy of the main resonation will leak out during the suprious mode. Hence, the resonator 1 in which the resonation leakage is reduced and it is possible to exhibit good resonation characteristics. Hereinafter, reasons thereof will be described.

First, conditions of an occurrence of the internal resonance are described. In order for the internal resonance to occur, the resonator element 2 necessarily has a plurality of inherent resonation modes, that is, the X-axial reversed-phase mode as the main resonation and at least one suprious mode (condition A1). Further, it is necessary to satisfy the following Expression (7) (condition A2). Here, a sign of "≅" in the following Expression (7) means that there is an allowable amount by which the internal resonance somewhat occurs even when the left side of the following Expression (7) is not exactly zero. Note that, when $f_n$ represents the resonance frequencies of the inherent resonation modes, at least a relationship of $f_i > 0$ is satisfied. In addition, n is a natural number of 2 or greater. Here, $k_1$, $k_2$, ..., $k_i$, ..., and $k_n$ in Expression (7) are integers and at least two of the integers are not 0 (≠0). In addition, i is a natural number of 1 to n.

$$k_1 f_1 + k_2 f_2 + \ldots + k_i f_i + \ldots + k_n f_n \cong 0 \quad (7)$$

In addition, in this case, the following condition is not necessary in relation to the internal resonance; however, it is necessary for a frequency Ω (>0) of an electrical signal, at which the main resonation is excited, to be substantially equal to the resonance frequency $f_1$ of the main resonation, in order to actually excite the main resonation. In other words, it is necessary to satisfy a relationship of $\Omega \cong f_1$ (condition A3). Here, the description of "being substantially equal" is used, for example, because there is a slight difference between an electrically excited resonance frequency by an oscillation circuit and a mechanically excited resonance frequency of the main resonation; however, hereinafter, "being substantially equal" is not used, but "being equal" is used to have the same meaning as that.

In addition, since it is assumed that only the main resonation is directly and electrically excited in the invention, to be exact, the resonance frequency $f_1$ of the main resonation is an electrically excited series resonance frequency, and is approximated to the mechanically excited resonance frequency in an electrically short-circuited state. Thus, the resonance frequencies are considered to be the same. A difference between a mechanically excited resonance frequency in an electrically released state and the mechanically excited resonance frequency in the electrically short-circuited state as long as a capacity ratio γ is 300 or higher, and thus, in this case, both resonance frequencies are also considered to be the same. In other words, as long as the capacity ratio γ of the main resonation is 300 or higher, the resonance frequency $f_1$ of the main resonation is any one of the electrically excited series resonance frequency, the mechanically excited resonance frequency in the electrically short-circuited state, and the mechanically excited resonance frequency in the electrically released state, and as long as the capacity ratio γ of the main resonation is lower than 300, the resonance frequency $f_1$ of the main resonation is one of the electrically excited series resonance frequency or the mechanically excited resonance frequency in the electrically short-circuited state.

In addition, since it is assumed that only the main resonation is directly and electrically excited in the invention, to be exact, the resonance frequency of the suprious mode is approximated to the mechanically excited resonance frequency in the electrically released state; however, as long as the capacity ratio γ of the suprious mode is 300 or higher, the electrically excited series resonance frequency and the mechanically excited resonance frequency in the electrically released state are considered to be the same, similar to the case of the main resonation.

This is because the difference is negligibly small, even in comparison with Expression (4) described above or Expression (14) which will be described below. Note that it is possible to measure the resonance frequency of a main resonation mode or the suprious mode by using a heterodyne interferometric method or the like in a state in which the lid 92 is detached from the package 9. At this time, as long as resonational displacements of the resonation modes does not excessively increase, the inventors check that an error is very small in the measurement in a pressure reduction state even which the measurement is performed while the inside of the package 9 is in an atmosphere state.

The internal resonance occurs by satisfying all of the conditions A1, A2, and A3 described above. Therefore, the internal resonance may be reduced as long as at least one of the conditions A1, A2, and A3 is not satisfied. The resonator 1 is configured not to satisfy the condition A2. In other words, the resonator 1 satisfies the following Expression (8), instead of Expression (7) above.

$$k_1 f_1 + k_2 f_2 + \ldots + k_i f_i + \ldots + k_n f_n \neq 0 \quad (8)$$

Next, the allowable amount contained in the sign of "≅" in Expression (7) above will be defined. When $f_1'$ represents a virtual resonance frequency which is approximate to the main resonation, it is possible to define $f_1'$ in the following Expression (9).

$$f_1' \equiv \frac{k_2 f_2 + k_3 f_3 + \ldots + k_n f_n}{-k_1} \quad (9)$$

The virtual resonance frequency $f_1'$ is calculated from a resonance frequency of the inherent resonation mode of resonation other than the main resonation, and the strongest internal resonance occurs when the resonance frequency is equal to the resonance frequency $f_1$ of the main resonation. When Δf represents a value obtained by normalizing, by the resonance frequency $f_1$ of the main resonation, a difference between the virtual resonance frequency $f_1'$ which is approximate to the main resonation and the resonance frequency $f_1$ of the main resonation, $\Delta f$ is the allowable amount described above, and can be described in the following Expression (10).

$$\Delta f = \frac{f_1' - f_1}{f_1} \tag{10}$$

When substitution with Expression (9) is performed in Expression (10) above, the following Expression (11) is obtained.

$$\Delta f \equiv \left( \frac{k_2 f_2 + k_3 f_3 + \ldots + k_n f_n}{-k_1} - f_1 \right) \Big/ f_1 \tag{11}$$

When Expression (11) above is reorganized, it is possible to obtain the following Expression (3). Hence, Expression (3) above is satisfied, and thereby the resonator 1 in which the internal resonance of the resonator element 2 is reduced is obtained. Here, as described above, $k_1, k_2, \ldots, k_i, \ldots,$ and $k_n$ in Expression (7) are integers and at least two of the integers are not 0. It is preferable that a resonance frequency $f_m$ having, as a coefficient, k (to be $k_m$) which is not 0 is substantially the same as a resonance frequency of a resonation mode in which the resonating arms 22 and 23 flexurally resonate in the Z-axial direction orthogonal to the X axis as the resonating direction of the main resonation, that is, a resonance frequency of the Z-axial same-phase mode or the Z-axial reversed-phase mode. In other words, it is preferable that the resonator 1 has the Z-axial same-phase mode or the Z-axial reversed-phase mode as the suprious mode (inherent resonation mode). In addition, it is preferable to include the high-order modes, particularly, it is preferable to include the lowest-order mode or a secondary mode. Δf other suprious modes, such suprious modes are, particularly, resonations that are easily coupled with the X-axial reversed-phase mode as the main resonation. Therefore, Expression (3) is satisfied, and thereby effects increase.

In addition, the resonator 1 has, preferably, an suprious mode having a resonance frequency $f_j$ which is five times or less the resonance frequency $f_1$ of the main resonation, and, more preferably, an suprious mode having a resonance frequency $f_j$ which is three times or less the resonance frequency. In other words, preferably, a relationship of $0 < f_j \leq 5 f_1$ is satisfied, and more preferably, a relationship of $0 < f_j \leq 3 f_1$ is satisfied. There is a possibility that the suprious modes of such frequencies will be strongly coupled with the main resonation. Therefore, Expression (3) is satisfied, and thereby effects increase.

In addition, the resonator 1 satisfies, preferably, Expression (4) in all of the suprious modes having the resonance frequency which is three times or less the resonance frequency $f_1$ of the main resonation, and satisfies, more preferably, Expression (4) in all of the suprious modes having the resonance frequency which is ten times or less the resonance frequency. Such relationships are satisfied, and thereby it is possible to reduce a possibility of an occurrence of the internal resonance between the main resonation and the suprious modes which are likely to be strongly coupled with the main resonation.

In addition, it is preferable to have an suprious mode having a resonance frequency which is lower than the resonance frequency $f_1$ of the main resonation mode. In other words, it is preferable to have an suprious mode having a resonance frequency $f_2$ which satisfies a relationship of $f_2 < f_1$ with respect to the resonance frequency $f_1$ of the main resonation mode. In addition, it is more preferable to have an suprious mode having a resonance frequency $f_2$ which satisfies a relationship of $f_1/10 \leq f_2 < f_1$, and it is still more preferable to have an suprious mode having a resonance frequency $f_2$ which satisfies a relationship of $f_1/3 \leq f_2 < f_1$. This is because, of the suprious modes, particularly the suprious mode having the resonance frequency which is lower than that of the main resonation mode is likely to be coupled with the main resonation and results in the internal resonance.

Note that, as described above, the resonator 1 satisfies Expression (5) above. In Expression (5), an order of the internal resonance is limited. An order of the internal resonance has a relationship with an order of nonlinearity, and, the lower the order of the nonlinearity, the greater an impact of the internal resonance even when the nonlinearity is small. Therefore, Expressions (5) and (4) are satisfied, and thereby, particularly, it is possible to effectively reduce the possibility of an occurrence of the internal resonance in a condition in which the internal resonance has the great impact.

Note that there is no particular limitation on the resonator, as long as the resonator 1 satisfies Expression (5); however, it is preferable to satisfy the following Expression (12), and it is more preferable to satisfy the following Expression (13). In this manner, coupling of the main resonation with suprious mode is unlikely to occur even in the resonator 1 that exhibits remarkable low-order nonlinearity, and thus it is possible to reduce resonation leakage of the main resonation due to the suprious mode.

$$3 \leq \Sigma_{j=1}^{n} |k_j| \leq 6 \tag{12}$$

$$3 \leq \Sigma_{j=1}^{n} |k_j| \leq 4 \tag{13}$$

In addition, n is preferably 3 or higher, and more preferably 2. The lower the value of n, the easier the internal resonance is likely to occur. Therefore, the effects according to the invention increase.

In addition, in the resonator 1, as described above, Expression (4) is satisfied. When $|\Delta f|$ is approximated to 0, the suprious mode is likely to occur through the internal resonance with the main resonation. Therefore, Expression (4) is satisfied, and thereby, it is possible to reduce an occurrence of the suprious mode. Hereinafter, this will be described in brief. In addition, hereinafter, for the convenience of the description, a case where the suprious mode is the X-axial in-phase mode is representative described, and the suprious modes other than the X-axial in-phase mode are also verified to satisfy the same relationships.

FIG. 7 is a graph illustrating a relationship between $|\Delta f|$ and the Q value. FIG. 7 shows observed values of $\Delta f$ obtained in a case where the resonance frequency $f_1$ of the X-axial reversed-phase mode as the main resonation mode to the resonance frequency $f_2$ of the X-axial in-phase mode as the suprious mode approaches 1:1, that is, $\Delta f = (f_2 - f_1)/f_1$, and the same effects are verified to be also achieved in coupling other than the coupling of 1:1. Note that, in FIG. 7, the vertical axis represents indexes obtained by normalizing Q values with the maximum value of the Q value (that is, the maximum value of the indexes is 1). In addition, FIG. 7 shows observed values obtained by using the resonator element 2 in which the resonating arms 22 and 23 have a length L of 930 μm, the resonating arms 22 and 23 have a width W of 60 μm, an entire length of the resonator element is 1,160 μm, and an entire width of the resonator element is 520 μm.

As understood in FIG. 7, as long as Expression (4) is satisfied, it is possible to exhibit 60% or higher of the maximum value of the normalized indexes, and thus it is possible to sufficiently reduce the occurrence of the suprious mode. Note that there is no particular limitation on the resonator 1 as long as the resonator satisfies Expression (4); however, it is preferable to satisfy the following Expression (14A), it is more preferable to satisfy the following Expression (14B), and it is still more preferable to satisfy the following Expression (14C). In this manner, it is possible to more effectively reduce the occurrence of the suprious mode through the internal resonance with the main resonation, and thus it is possible to further reduce a possibility of an increase in the resonation leakage.

As long as Expression (4) and the following Expressions (14A) to (14C) are satisfied at normal temperature, it is possible to reduce leakage of energy of the main resonation at normal temperature. In addition, as long as Expression (4) and the following Expressions (14A) to (14C) are satisfied in an operating temperature range including the normal temperature, for example, in general, a range of −40° C. to 85° C., that is, in an entire range of −40° C. to 150° C. in vehicle-mounted resonator, it is possible to reduce the energy leakage of the main resonation within the temperature range.

$$|\Delta f| \geq 0.05 \quad (14A)$$

$$|\Delta f| \geq 0.1 \quad (14B)$$

$$|\Delta f| \geq 0.2 \quad (14C)$$

Next, some specific examples are described in cases where the number (n) of the inherent resonation modes is 2, 3, and 4. Note that, hereinafter, a relationship of the following Expression (15) is satisfied. In addition, $f_1$ represents the resonance frequency of the main resonation, and $f_2$ represents the frequency of the suprious mode.

$$m = \Sigma_{j=1}^{n} |k_j| \quad (15)$$

Specific Example 1: m=3 and n=2

In this case, it is possible to derive the following Expression (16) from Expression (9) above.

$$f_1' = -\frac{k_2}{k_1} f_2 \quad (16)$$

For example, in a case of $k_1=1$ and $k_2=-2$, $f_1'=2f_2$, and thus it is possible to derive the following Expression (17) from Expression (10). In addition, in a case of $k_1=2$ and $k_2=-1$, $f_1'=f_2/2$, and thus it is possible to derive the following Expression (18) from Expression (10).

$$\Delta f = \frac{2f_2 - f_1}{f_1} \quad (17)$$

$$\Delta f = \frac{\frac{f_2}{2} - f_1}{f_1} \quad (18)$$

In addition, since it is necessary to satisfy Expression (5) (or Expression (13) or Expression (15)) in the invention, it is necessary to satisfy $3 \leq |k_1| + |k_2|$ in a case of n=2. In other words, a condition of $k_1=1$ and $k_2=-1$ is not included in the invention. In such a condition, $f_1'=f_2$ is derived from Expression (16) above, $\Delta f=(f_2-f_1)/f_1$ is derived from Expression (10) above, and, eventually, a relationship of $f_2 \cong f_1$ is derived from a condition of $|\Delta f| \cong 0$. This means that the resonance frequency $f_1$ of the main resonation mode and the resonance frequency $f_2$ of the suprious mode are approximated to and coupled with each other as known in the related art. The invention discloses a coupling state which is not completely understood from the coupling that occurs by the approximation of the resonance frequency of the main resonation mode to the resonance frequency of the suprious mode which is known in the related art.

In addition, in the invention, as a premise, the electrical signal that excites the main resonation is only a sine wave signal having a frequency Ω which is the same as the resonance frequency of the main resonation, or the electrical signal in a state close to the sine wave signal, and the electrical signal is input. For example, in a case where a square wave is input as the electrical signal, a sine wave having a frequency component obtained by multiplying Ω by odd numbers (3Ω, 5Ω, and the like), in addition to the sine wave of the frequency Ω, is input. Thus, in a case where one of the frequencies obtained by multiplying Ω by odd numbers (particularly, 3Ω with a low number, having a significant amplitude and thus having a great influence) is approximated to one resonance frequency of the suprious modes, the suprious mode is excited; however, this case does not occur in the invention. In addition, in a case where a duty cycle is not 50%, the sine wave having a frequency component obtained by multiplying Ω by even numbers (2Ω, 4Ω, and the like); however, this case does not occur in the invention, either.

Specific Example 2: m=3 and n=3

In this case, it is possible to derive the following Expression (19) from Expression (9) above.

$$f_1' = -\frac{k_2 f_2 + k_3 f_3}{-k_1} f_2 \quad (19)$$

For example, in a case of $k_1=-1$ and $k_2=k_3=1$, $f_1'=f_2+f_3$, and thus it is possible to derive the following Expression (20) from Expression (10). In addition, in a case of $k_1=k_3=-1$ and $k_2=1$, $f_1'=f_2-f_3$, and thus it is possible to derive the following Expression (21) from Expression (10).

$$\Delta f = \frac{f_2 + f_3 - f_1}{f_1} \quad (20)$$

$$\Delta f = \frac{f_2 - f_3 - f_1}{f_1} \quad (21)$$

Specific Example 3: m=4 and n=2

For example, in a case of $k_1=-1$ and $k_2=3$, $f_1'=3f_2$, and thus it is possible to derive the following Expression (22) from Expression (10). In addition, in a case of $k_1=-3$ and $k_2=1$, $f_1'=f_2/3$, and thus it is possible to derive the following Expression (23) from Expression (10).

$$\Delta f = \frac{3f_2 - f_1}{f_1} \quad (22)$$

-continued $$\Delta f = \frac{\frac{f_2}{3} - f_1}{f_1} \quad (23)$$

Specific Example 4: m=4 and n=3

For example, in a case of $k_1=-2$ and $k_2=k_3=1$, $f_1'=(f_2+f_3)/2$, and thus it is possible to derive the following Expression (24) from Expression (10). In a case of $k_1=-2$, $k_2=1$, and $k_3=-1$, $f_1'=(f_2-f_3)/2$, and thus it is possible to derive the following Expression (25) from Expression (10). In a case of $k_1=-1$, $k_2=2$, and $k_3=1$, $f_1'=2f_2+f_3$, and thus it is possible to derive the following Expression (26) from Expression (10). In addition, in a case of $k_1=-1$, $k_2=2$, and $k_3=-1$, $f_1'=2f_2-f_3$, and thus it is possible to derive the following Expression (27) from Expression (10).

$$\Delta f = \frac{\frac{f_2 + f_3}{2} - f_1}{f_1} \quad (24)$$

$$\Delta f = \frac{\frac{f_2 - f_3}{2} - f_1}{f_1} \quad (25)$$

$$\Delta f = \frac{2f_2 + f_3 - f_1}{f_1} \quad (26)$$

$$\Delta f = \frac{2f_2 - f_3 - f_1}{f_1} \quad (27)$$

Specific Example 4: m=4 and n=4

In this case, it is possible to derive the following Expression (28) from Expression (9) above.

$$f_1' = \frac{k_2 f_2 + k_3 f_3 + k_4 f_4}{-k_1} \quad (28)$$

For example, in a case of $k_1=-1$ and $k_2=k_3=k_4=1$, $f_1'=f_2+f_3+f_4$, and thus it is possible to derive the following Expression (29) from Expression (10). In a case of $k_1=k_3=-1$ and $k_2=k_4=1$, $f_1'=f_2-f_3+f_4$, and thus it is possible to derive the following Expression (30) from Expression (10). In a case of $k_1=k_4=-1$ and $k_2=k_3=1$, $f_1'=f_2+f_3-f_4$, and thus it is possible to derive the following Expression (31) from. Expression (10). In addition, in a case of $k_1=k_3=k_4=-1$ and $k_2=1$, $f_1'=f_2-f_3-f_4$, and thus it is possible to derive the following Expression (32) from Expression (10).

$$\Delta f = \frac{f_2 + f_3 + f_4 - f_1}{f_1} \quad (29)$$

$$\Delta f = \frac{f_2 - f_3 + f_4 - f_1}{f_1} \quad (30)$$

$$\Delta f = \frac{f_2 + f_3 - f_4 - f_1}{f_1} \quad (31)$$

$$\Delta f = \frac{f_2 - f_3 - f_4 - f_1}{f_1} \quad (32)$$

Next, a case where an inherent resonation mode is specifically designated is described on the basis of some specific examples.

Specific Example 1

For example, in a case where the resonator element 2 has the X-axial reversed-phase mode (resonance frequency $f_1$=32.768 kHz) as the main resonation mode and the Z-axial same-phase mode (resonance frequency $f_2$=20.49 kHz) as the suprious mode, it is necessary to satisfy $k_1 f_1 + k_2 f_2 = 0$ as a condition under which the strongest internal resonance occurs. However, a combination of $\{k_1, k_2\}$ that satisfies the above expression in a range of m≤10 (refer to Expression (5)) does not exist. Hence, in this case, Expression (8) above is satisfied and |Δf| is the smallest value with an example of m=3 as a condition, |Δf|=25.06% from Expression (17) above, and it is difficult for the suprious mode to be coupled with the main resonation.

Specific Example 2

For example, in a case where the resonator element 2 has the X-axial reversed-phase mode (resonance frequency $f_1$=32.768 kHz) as the main resonation and the Z-axial reversed-phase mode (resonance frequency $f_2$=82.05 kHz) as the suprious mode, it is necessary to satisfy $k_1 f_2 + k_2 f_2 = 0$ as a condition under which the strongest internal resonance occurs. However, a combination of $\{k_1, k_2\}$ that satisfies the above expression in a range of m≤10 (refer to Expression (5)) does not exist. Hence, in this case, Expression (8) above is satisfied and |Δf| is the smallest value with an example of m=3 as a condition, |Δf|=25.20% from Expression (18) above, and it is difficult for the suprious mode to be coupled with the main resonation.

The above description is provided on the basis of the specific example. Note that there is no particular limitation on the sizes of the resonator element 2; however, the resonating arms 22 and 23 have the length L that satisfies, preferably, a relationship of 0.1 mm≤L≤0.9 mm, more preferably, a relationship of 0.2 mm≤L≤0.7 mm, and still more preferably, a relationship of 0.3 mm≤L≤0.5 mm. In addition, the resonating arms 22 and 23 have a thickness T that satisfies, preferably, a relationship of 50 μm≤T≤150 μm, more preferably, a relationship of 80 μm≤T≤140 μm, and still more preferably, a relationship of 120 μm≤T≤130 μm. In addition, the arm portions 221 and 231 of the resonating arms 22 and 23 have the width W that satisfies, preferably, 12.8 μm≤W≤45 μm, more preferably, 15 μm≤W≤50 μm, and still more preferably, 20 μm≤W≤30 μm. In addition, main surfaces (banks) remaining on both sides of the grooves 222 and 223 (232 and 233) of the arm portion 221 (231) have a width W' that satisfies, preferably, a relationship of 1 μm≤W'≤6 μm, more preferably, a relationship of 1 μm≤W'≤4.5 μm, and still more preferably, a relationship of 1 μm≤W'≤3 μm. In addition, the wide portion 229 (239) has a length L' that satisfies, preferably, a relationship of 0.1≤L'/L≤0.5, more preferably, a relationship of 0.1≤L'/L≤0.35, and still more preferably, a relationship of 0.1≤L'/L≤0.25. In addition, the wide portion 229 (239) has a width W" and the length L' that satisfy, preferably, a relationship of L'<W".

The resonator element 2 has such sizes, and thereby the resonator element 2 is relatively reduced in size. Therefore, in a case of where the resonating body 20 is achieved through patterning of a quartz crystal wafer by using wet etching, particularly, symmetry of the shape is impaired, nonlinearity increases, and the internal resonance between the main resonation and the unnecessary resonation is likely to occur due to anisotropy through the etching of the quartz crystal substrate. Accordingly, the energy of the main resonation is likely to leak outside via the unnecessary resonation that is not designed to have small resonation leakage (or that is difficult to have small resonation leakage). In particularly, with the width W' set to be relatively narrow, the wide portions 229 and 239 provided, and further the relationship of L'<W'' satisfied, a cross-sectional shape of the resonating arms 22 and 23 is likely to have nonlinearity, and thus such a problem described above clearly arises. Hence, in the resonator 1 that is provided with the resonator element 2 having a size with which such unnecessary resonations are likely to occur, the conditions described above are satisfied, and thereby it is possible to exhibit the remarkable effects described above.

Further, in a case where only the pair of resonating arms extending in the same direction is provided as the resonating arms similar to a tuning fork type resonator element as in the embodiment, the invention operates more effectively because the resonator does not have the symmetry of the shape in a direction opposite to the extending direction with the base portion as a reference. In addition, since the crystal plane in the quartz crystal is complicatedly formed, the invention operates furthermore effectively in a case where the resonator element is formed by using the wet etching with the quartz crystal as the substrate.

Next, effects (effects that are not described above) obtained by satisfying Expression (4) described above will be described. FIG. 8 is a graph illustrating a relationship between Δf and ambient temperature related to a normal sample S1 and two abnormal samples S2 and S3. Here, Δf corresponds to Expression (18) above, $f_1$ (=32.768 kHz) represents the resonance frequency of the X-axial reversed-phase mode as the main resonation mode, and $f_2$ represents the resonance frequency of the Z-axial same-phase mode as the suprious mode which is considered to cause the internal resonance to occur with the main resonation. In other words, Δf means a value indicating a difference between $f_2$ and 65.536 kHz (a frequency which is twice $f_1$).

On the other hand, FIG. 9 is a graph illustrating a relationship between a CI increase rate and ambient temperature related to the normal sample S1 and the two abnormal samples S2 and S3. FIG. 10 is a graph illustrating a relationship between CI and ambient temperature related to the normal sample S1 and the two abnormal samples S2 and S3. FIGS. 9 and 10 are graphs illustrating how much the CI increase rate (CI value) changes from a reference, with the CI value at −50° as the reference (0).

As illustrated in FIGS. 9 and 10, the CI increase rate (CI value) moderately increases in the normal sample S1, the CI increase rate abnormally increases at around 35° C. in the abnormal sample S2, and the CI increase rate abnormally increases at around 110° C. in the abnormal sample S3. With the abnormal samples S2 and S3, the temperatures at which the CI increase rates abnormally increase are substantially equal to temperatures at which Δf is 0% in FIG. 8. Therefore, the relationship in Expression (4) above is satisfied (that is, removing Δf that is around 0%), and thereby it is possible to reduce an abnormal increase in the CI increase rate (CI value). Note that, when the resonator 1 satisfies Expression (4) in any temperature ranges of the operating temperature ranges (−40° C. to 85° C., −40° C. to 150° C. in the vehicle-mounted resonator, and the like), it is possible to reduce an occurrence of the abnormal increase of the CI value described above by using the temperature ranges. Preferably, when Expression (4) is satisfied in all of the temperatures in the operating temperature ranges, it is possible to reduce a possibility of an occurrence of the abnormal increase in the CI value described above in the operating temperature range.

In addition, when the Q value of the resonator element 2 is Q in the resonator 1, a relationship in the following Expression (33) is satisfied, f0max in Expression (33) satisfies a relationship in the following Expression (34), and Wemin in Expression (34) satisfies a relationship in the following Expression (35). The relationships are satisfied, and thereby the resonator element 2 which is small and has a sufficiently high Q value is obtained.

$$Q \geq \frac{\rho C_p}{c\alpha^2 \Theta} \times \frac{1 + \left(\frac{f_1}{f0_{max}}\right)^2}{\frac{f_1}{f0_{max}}} \tag{33}$$

$$f0_{max} = \frac{\pi k}{2\rho C_p W_{emin}^2} \tag{34}$$

$$W_{emin} = C(AL + B) \tag{35}$$

Here, in Expressions (33), (34), and (35), $A=7.3690\times10^{-2}$, $B=1.2544\times10^{-5}$, $C=1.1$ to $1.3$, f0max [Hz] represents a resonance frequency (thermal-relaxation frequency) at which the maximum thermoelastic loss occurs when an equivalent arm width We of the resonating arms 22 and 23, which is obtained when the cross-sectional shape of the resonating arms 22 and 23 (arm portions 221 and 231) is replaced with a rectangular shape such that the same thermoelastic loss occurs, is the minimum value Wemin which will be described below, L [m] represents a length related to the extending direction of the resonating arms 22 and 23, ρ [kg/m³] represents a mass density of the resonating arms 22 and 23, Cp [J/(kg·K)] represents heat capacity of the resonating arms 22 and 23, c [N/m²] represents an elastic constant related to the extending direction of the resonating arms 22 and 23, α [1/K] represents a coefficient of thermal expansion related to the extending direction of the resonating arms 22 and 23, Θ [K] represents ambient temperature, k [W/(m·K)] represents thermal conductivity of the resonating arms 22 and 23 in the resonating direction of the main resonation, and π represents a ratio of the circumference of a circle to the diameter.

Hereinafter, a derivation method of Expression (33) will be described. First, the following Table 1 shows relationships between the lengths L of the resonating arms 22 and 23, which are considered to be effective to achieve miniaturization, and the minimum values Qmin of the Q value obtained when the resonating arms have the lengths. Such relationships are satisfied, and thereby the resonator 1 provided with the resonator element 2, which is small and has higher Q value, is obtained. Hence, for example, since it is possible to reduce power consumption of the oscillation circuit (for example, an oscillation circuit 111) using the resonator 1, and it is possible to reduce emission of $CO_2$ which is produced during manufacturing of the miniaturized circuit, the resonator 1 has a low environmental burden.

TABLE 1

| L [m] | Qmin |
| --- | --- |
| $1.8 \times 10^{-3}$ | 50000 |
| $1.4 \times 10^{-3}$ | 35000 |
| $8.0 \times 10^{-4}$ | 12000 |

Substitution of $f_1$=32.768 kHz and Qmin with $Q_{TED}$ (Q value obtained in consideration of only the thermoelastic loss) is performed in the following Expressions (36) and (37), the width W, which satisfies a relationship of $f_1 > f0$, is calculated, and the minimum value Wemin with respect to the length L is calculated. Calculation results of the minimum value Wemin are shown in the following Table 3. Note that numerical values in Expressions (36) and (37) are as follows in the following Table 2. As described above, f0 represents the thermal-relaxation frequency, and $f_1 > f0$ ($f_1/f0 > 1$) means that the resonator element 2 is in the adiabatic region.

TABLE 2

| Material | k[W/(m*k)] | Cp[J/(kg*k)] | ρ[kg/m³] | α[k⁻¹] | c[N/m²] |
|---|---|---|---|---|---|
| Quartz crystal | 6.65 | 735.3718 | 2649 | 1.37 × 10⁻⁵ | 8.67 × 10¹⁰ |

$$Q_{TED} = \frac{\rho C_p}{c\alpha^2 \Theta} \times \frac{1 + \left(\frac{f_1}{f0}\right)^2}{\frac{f_1}{f0}} \quad (36)$$

$$f0 = \frac{\pi k}{2\rho C_p W^2} \quad (37)$$

TABLE 3

| L [m] | Qmin | Wemin [m] |
|---|---|---|
| 1.8 × 10⁻³ | 50000 | 1.429 × 10⁻⁴ |
| 1.4 × 10⁻³ | 35000 | 1.195 × 10⁻⁴ |
| 8.0 × 10⁻⁴ | 12000 | 6.996 × 10⁻⁵ |

The minimum value Wemin with respect to the length L is obtained in the graph shown in FIG. 11, and thus an approximate expression is Wemin=7.3690×10⁻² L+1.2544× 10⁻⁵. Further, the right side of this expression is multiplied by a coefficient C (here, C is 1.1 to 1.3), and thereby it is possible to obtain Expression (35) above. With Expression (35), it is possible to calculate the minimum value Wemin of the width W of the resonating arms 22 and 23 with respect to the length L of the resonating arms 22 and 23. Further, substitution with the obtained minimum value Wemin is performed in Expression (37), and thereby it is possible to calculate f0. Note that f0 is the resonance frequency (=f0max) that causes the thermoelastic loss to become the maximum when the width W of the resonating arms 22 and 23 is the minimum value Wemin. As described above, in the embodiment, since limitation to the adiabatic region ($f_1 > f0$) is set, it is possible to determine Qmin ($Q_{TED}$) as the lower limit value of the Q value by f0. In other words, substitution with f0 is performed in Expression (36), and thereby it is possible to calculate Qmin. When a relationship of Q≥Qmin is satisfied, a sufficiently high Q value is obtained, and thus, Expression (33) is derived.

Next, a phenomenon in which the resonance frequency $f_1$ of the main resonation changes due to the amplitude of the resonating arms will be described. In a resonation system (system having a different resonation cycle due to the amplitude) which has nonlinearity as the resonator element 2, a relationship between the amplitude of the resonating arms and the resonance frequency $f_1$ of the main resonation is the relationship illustrated in FIG. 12 or 13. FIGS. 12 and 13 are graphs illustrating a relationship between the resonance frequency $f_1$ and the amplitude of the resonating arms when excitation power DL, which is applied to the resonator element so as to electrically excite the main resonation (the X-axial reversed-phase mode), is changed. The resonance frequency $f_1$ increases as the excitation power DL increases in the graph in FIG. 12, and the resonance frequency $f_1$ decreases as the excitation power DL increases in the graph in FIG. 13. In recent years, an increase in strain energy density due to the miniaturization of the resonator element causes the nonlinearity to be remarkable, and Δfd is likely to increase when $f_1"$ represents the resonance frequency $f_1$ obtained when some excitation power DL is applied, and $|f_1" - f_1'|/f_1' = \Delta fd$ [ppm]. When Δfd increases, accuracy of frequency is likely to deteriorate. Here, $f_1'$ in this case represents the resonance frequency obtained when sufficiently low excitation power DL is applied.

Next, regarding the main resonation, a relationship between the excitation power DL and the amplitude of the resonating arms obtained in a case where the internal resonance does not occur in the resonator element and a relationship between the excitation power DL and the amplitude of the resonating arms obtained in a case where the internal resonance occurs in the resonator element will be described with an example. As illustrated in FIG. 14, in the case where the internal resonance does not occur, the excitation power DL and the amplitude of the resonating arms have a proportional (linear) relationship (for the convenience of the description, here, with the nonlinearity described in FIGS. 12 and 13 ignored). On the other hand, as illustrated in FIG. 15, in the case where the internal resonance occurs in the resonator element, the amplitude does not increase with respect to the increase in the excitation power DL in a region of the excitation power DL which is higher than the excitation power DL with which the internal resonance occurs. This is because a part of the excitation power DL is used for the excitation of the suprious mode. In other words, the main resonation occurring in a state of the occurrence of the internal resonance enters a state in which the main resonation behaves as though the excitation power decreases although the same excitation power DL is applied, compared to the main resonation occurring in a state of the nonoccurrence of the internal resonance. The excitation power of the main resonation in the state in which the main resonation behaves as though the excitation power decreases is referred to as "effective excitation power". As a result, the resonance frequency of the main resonation changes as described in FIG. 13. This phenomenon is completely different from the change in the frequency occurring only in the linearity in a case where the main resonation mode and the suprious mode have substantially the same resonance frequency as known in the related art.

Next, regarding the main resonation, frequency-temperature characteristics obtained in the case where the internal resonance does not occur in the resonator element and frequency-temperature characteristics obtained in the case where the internal resonance occurs in the resonator element will be described with an example. As illustrated in FIG. 16, in the case where the internal resonance does not occur in the resonator element, a regular curve (quadratic curve) is drawn, and the resonance frequency does not have a local change. On the other hand, as illustrated in FIG. 17, in the case where the internal resonance occurs in the resonator element, the resonance frequency locally changes at a temperature at which $|\Delta f|=0$ (Δf expressed by Expression (3)) and at around the temperature, and thus the frequency-temperature characteristics are degraded. Note that a solid line in FIG. 17 represents a change obtained in a case of having the characteristics shown in FIG. 12, and a chain line represents a change obtained in a case of having the characteristics shown in FIG. 13. Note that $\Delta f_{IR}$ represents an amount of a local change in the resonance frequency illustrated in FIG. 17.

As described above, when the internal resonance occurs in the resonator element, the frequency-temperature characteristics are degraded (with a portion in which the frequency is likely to locally change), and thus the accuracy of the frequency is likely to be lowered, as illustrated in FIG. 17. By comparison, since a possibility of an occurrence of the internal resonance in the resonator 1 (resonator element 2) of the embodiment is reduced, it is possible to reduce a possibility of arising of such a problem, and thus it is possible to increase the accuracy of the frequency, as illustrated in FIG. 16.

In particular, in the resonator 1, a ratio of $\Delta fd$ [ppm] (an amount of a change in the resonance frequency $f_1$ of the main resonation) to the excitation power DL [µW] is 20 [ppm/µW] or higher. In other words, a relationship of $\Delta fd/DL \geq 20$ [ppm/µW] is satisfied. In the resonator element that satisfies the relationship, a frequency-change amount $\Delta f_{IR}$ occurring due to the internal resonance increases, and thus a possibility that the occurrence of the internal resonance results in remarkable lowering of the accuracy of the frequency increases. Therefore, the possibility that the internal resonance occurs in the resonator element 2 that satisfies the relationship of $\Delta fd/DL \geq 20$ [ppm/µW] is reduced, and thereby the effects (that is, improvement of the accuracy of the frequency) of the invention increase. Note that, in FIG. 18, the excitation power DL and $\Delta fd$ have a substantially linear (proportional) relationship; however, the invention is not limited thereto, and the excitation power DL and $\Delta fd$ may not have the linear relationship. In this case, of the excitation power applied to cause an actual operation to be performed, the excitation power that satisfies at least the relationship of $\Delta fd/DL \geq 20$ [ppm/µW] exists, and thereby the effects of the invention are obtained. Further, it is preferable to satisfy the relationship of $\Delta fd/DL \geq 20$ [ppm/µW] in the entire range of the excitation power applied to cause the operation to be performed.

As described above, there is no particular limitation on the resonator 1 as long as the relationship of $\Delta fd/DL \geq 20$ [ppm/µW] is satisfied; however, it is preferable to satisfy the relationship of $\Delta fd/DL \geq 40$ [ppm/µW], and it is more preferable to satisfy the relationship of $\Delta fd/DL \geq 100$ [ppm/µW]. In this manner, the effects of the invention increase.

Here, the effects obtained when the relationship of $\Delta fd/DL \geq 20$ [ppm/µW] is satisfied are described with specific examples. For example, in a relationship of $\Delta fd/DL = 10$ [ppm/µW] which is not in the range, in a case where the effective excitation power DL of the main resonation is reduced from 0.2 µW to 0.1 µW due to the occurrence of the internal resonance, $\Delta fd = |10 \times (0.1 - 0.2)| = 1.0$ [ppm]. This value of $\Delta fd$ is very small, and is a substantially negligible level as long as significantly high accuracy of the frequency is not demanded. On the other hand, in a relationship of $\Delta fd/DL = 40$ [ppm/µW] which is in the range, in a case where the effective excitation power DL of the main resonation is reduced from 0.2 µW to 0.1 µW due to the occurrence of the internal resonance, $\Delta fd = |40 \times (0.1 - 0.2)| = 4.0$ [ppm]. This value of $\Delta fd$ is very large, and results in a significant problem not only in a case where the significantly high accuracy of the frequency is demanded, but also in a case where normal accuracy of the frequency is demanded.

Hence, the relationship of $\Delta fd/DL \geq 20$ [ppm/µW] is satisfied, and thereby it is possible to exhibit the effects described above.

There is no particular limitation on the excitation power DL; however, for example, it is preferable to satisfy a relationship of $0 < DL \leq 1.0$ [µW], it is more preferable to satisfy a relationship of $0 < DL \leq 0.1$ [µW], and it is still more preferable to satisfy a relationship of $0 < DL \leq 0.01$ [µW]. In this manner, it is possible to achieve power saving of the resonator 1.

In addition, C in Expression (35) is 1.2, and, preferably, 1.3, and thereby the remarkable effects described above are achieved. Specifically, C is 1.2, and, preferably, 1.3, thereby a higher Q value is obtained, and thus, the resonator element 2 having low CI value is obtained. Therefore, it is possible to achieve low power consumption of the resonator 1. Here, when the excitation power DL is fixed, the lower the CI value, the higher the amplitude of the resonating arms. Therefore, it is easy to exhibit the nonlinearity of the resonation of the resonating arms. Therefore, $\Delta fd/DL$ is likely to increase and, accordingly, the remarkable effects described above are achieved.

Second Embodiment

Next, a resonator according to a second embodiment of the invention will be described.

Figure 19:
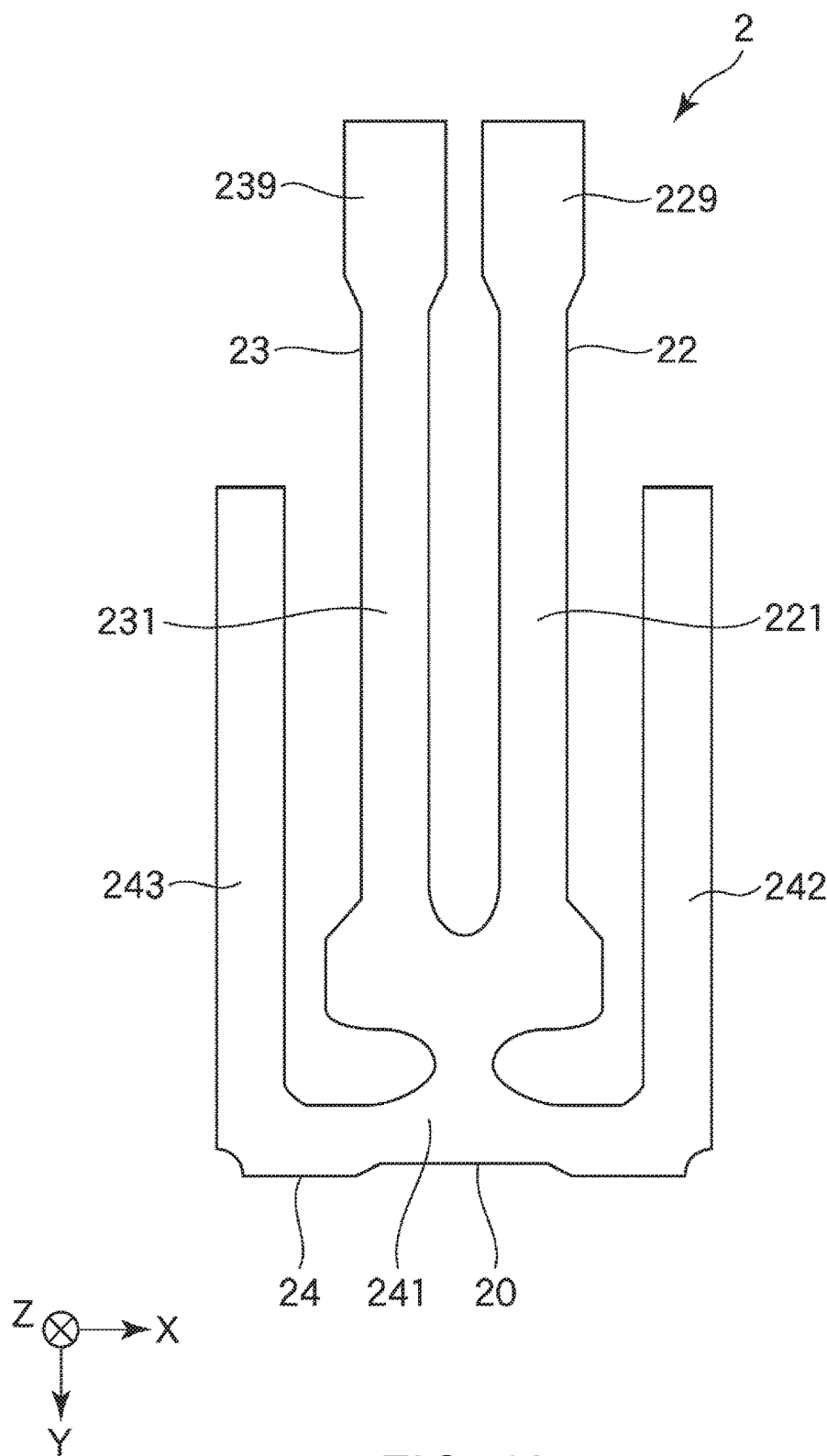
FIG. 19 is a plan view illustrating a resonator element which is provided in a resonator according to a second embodiment of the invention.

FIG. 19 is a plan view illustrating a resonator element which is provided in the resonator according to the second embodiment of the invention. Note that an electrode is omitted in FIG. 19, for convenience of description.

Hereinafter, the resonator of the second embodiment is described by focusing on differences from the first embodiment described above, and the same description is omitted.

The resonator according to the second embodiment of the invention is the same as that of the first embodiment described above except for a different configuration of the resonator element. Note that the same reference signs are assigned to the same configurations as those in the embodiment described above.

As illustrated in FIG. 19, the resonator element 2 of the embodiment is provided with the resonating arms 22 and 23 in which no groove is formed, and the resonating arms 22 and 23 are configured to have a flat top surface and a flat underside surface. In other words, the resonator element 2 of the embodiment has a configuration in which the grooves 222, 223, 232, and 233 are omitted from the resonator element 2 of the first embodiment.

In addition, with respect to the resonator element 2 of the first embodiment described above satisfying Expressions (1A) to (1D) in the adiabatic region, the resonator element 2 of the embodiment exists in the isothermal region, and thus it is possible to obtain the small resonator element 2 in which a decrease in the Q value is reduced. In order to achieve further remarkable effects, it is preferable to satisfy the following Expression (38A), it is more preferable to satisfy the following Expression (38B), it is still more preferable to satisfy the following Expression (38C), and it is all the more preferable to satisfy the following Expression (38D) is satisfied.

$$W < W_0 \tag{38A}$$

$$W < W_0/2 \tag{38B}$$

$$W > W_0/3 \tag{38C}$$

$$W > W_0/3.5 \tag{38D}$$

Also in the second embodiment as described above, it is possible to achieve the same effects as those in the first embodiment described above.

Third Embodiment

Next, a resonator according to a third embodiment of the invention will be described.

Figure 20:
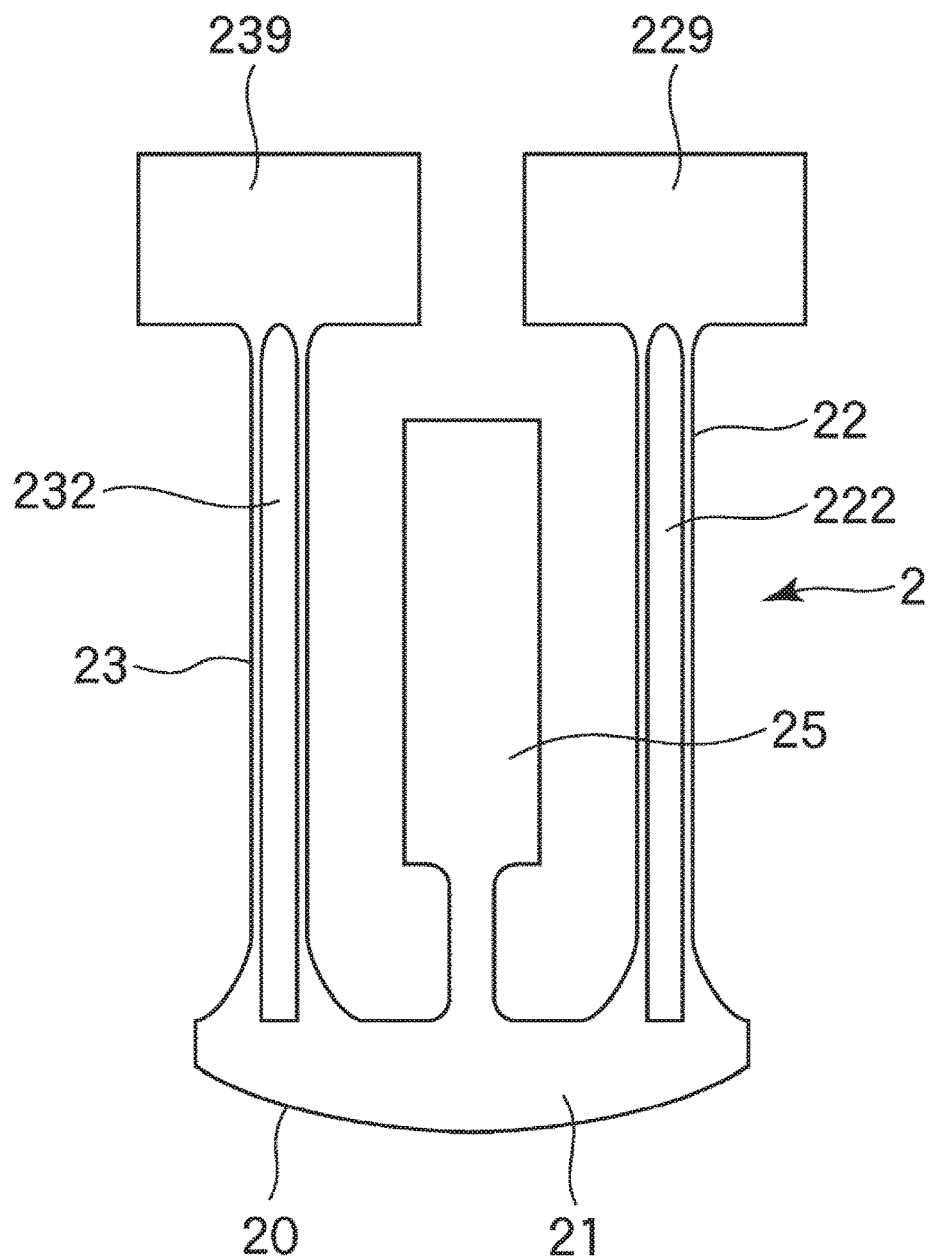
FIG. 20 is a plan view illustrating a resonator element which is provided in a resonator according to a third embodiment of the invention.
Figure 20:
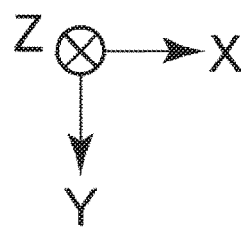

FIG. 20 is a plan view illustrating a resonator element which is provided in the resonator according to the third embodiment of the invention. Note that an electrode is omitted in FIG. 20, for convenience of description.

Hereinafter, the resonator of the third embodiment is described by focusing on differences from the first embodiment described above, and the same description is omitted.

The resonator according to the third embodiment of the invention is the same as that of the first embodiment described above except for a different configuration of the resonator element. Note that the same reference signs are assigned to the same configurations as those in the embodiment described above.

The resonating body 20, which the resonator element 2 of the embodiment has, is formed of the Z cut quartz crystal plate through the patterning using the photolithography method and the etching method (particularly, the wet etching method). As illustrated in FIG. 20, the resonating body 20 includes the base portion 21, the pair of resonating arms 22 and 23 that extends from the base portion 21 in the −Y-axial direction, and a support arm 25 that extends from the base portion 21 in the −Y-axial direction. The resonating arms 22 and 23 are aligned in the X-axial direction and extend from the base portion 21 in the −Y-axial direction so as to be parallel to each other. In addition, the support arm 25 extends from the base portion 21 in the −Y-axial direction so as to be positioned between the pair of resonating arms 22 and 23. Although not illustrated, in the resonator element 2, the first and second drive terminals 282 and 292 are provided under the support arm 25, and are attached to the base 91 via the conductive adhesive 97 under the support arm 25.

Also in the third embodiment as described above, it is possible to achieve the same effects as those in the first embodiment described above.

Fourth Embodiment

Next, a resonator according to a fourth embodiment of the invention will be described.

Figure 21:
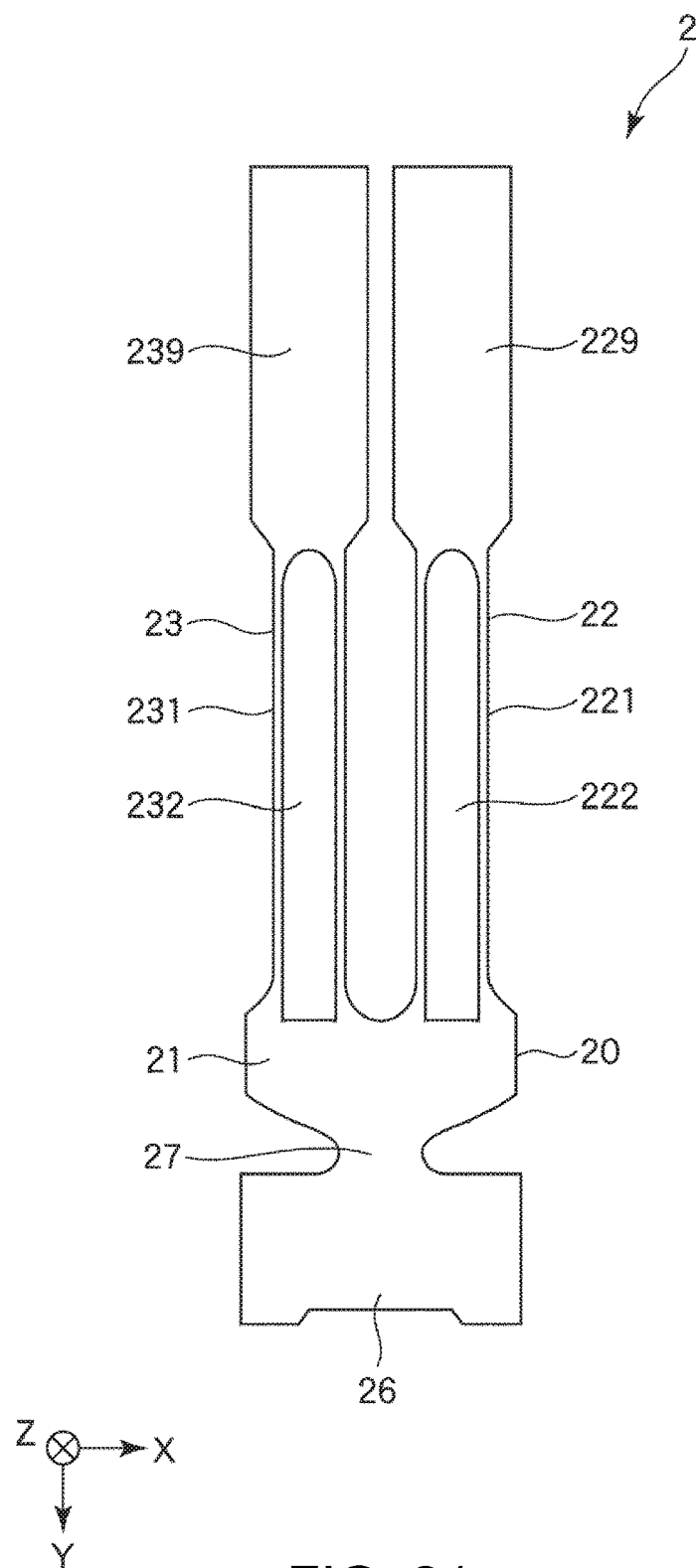
FIG. 21 is a plan view illustrating a resonator element which is provided in a resonator according to a fourth embodiment of the invention.

FIG. 21 is a plan view illustrating a resonator element which is provided in the resonator according to the fourth embodiment of the invention. Note that an electrode is omitted in FIG. 21, for convenience of description.

Hereinafter, the resonator of the fourth embodiment is described by focusing on differences from the first embodiment described above, and the same description is omitted.

The resonator according to the fourth embodiment of the invention is the same as that of the first embodiment described above except for a different configuration of the resonator element. Note that the same reference signs are assigned to the same configurations as those in the embodiment described above.

The resonating body 20, which the resonator element 2 of the embodiment has, is formed of the Z cut quartz crystal plate through the patterning using the photolithography method and the etching method (particularly, the wet etching method). As illustrated in FIG. 21, the resonating body 20 includes the base portion 21, the pair of resonating arms 22 and 23 that extends from the base portion 21 in the −Y-axial direction, a support 26 that is disposed on the +Y axis side of the base portion 21, and a connection portion 27 that is positioned between the base portion 21 and the support 26 and is connected to the base portion 21 and the support 26. Although not illustrated, in the resonator element 2, the first and second drive terminals 282 and 292 are provided under the support 26, and are attached to the base 91 via the conductive adhesive 97 under the support 26.

In addition, the connection portion 27 has a width (length in the X-axial direction) which is narrower than that of the base portion 21. In other words, the connection portion 27 has a width which is reduced from that of the base portion 21. The connection portion 27 is formed by forming a notch formed to have a width which is partially reduced from a dimension of the base portion 21 in the width direction thereof, from both side edges of the base portion at a position which is sufficiently separated from an end portion of the base portion 21 on the resonating arms 22 and 23 side. The connection portion 27 is provided, and thereby the resonation of the resonating arms 22 and 23 is difficult to be transmitted to the support 26. Therefore, it is possible to reduce the resonation leakage.

Also in the fourth embodiment as described above, it is possible to achieve the same effects as those in the first embodiment described above.

Fifth Embodiment

Next, a resonator according to a fifth embodiment of the invention will be described.

Figure 22:
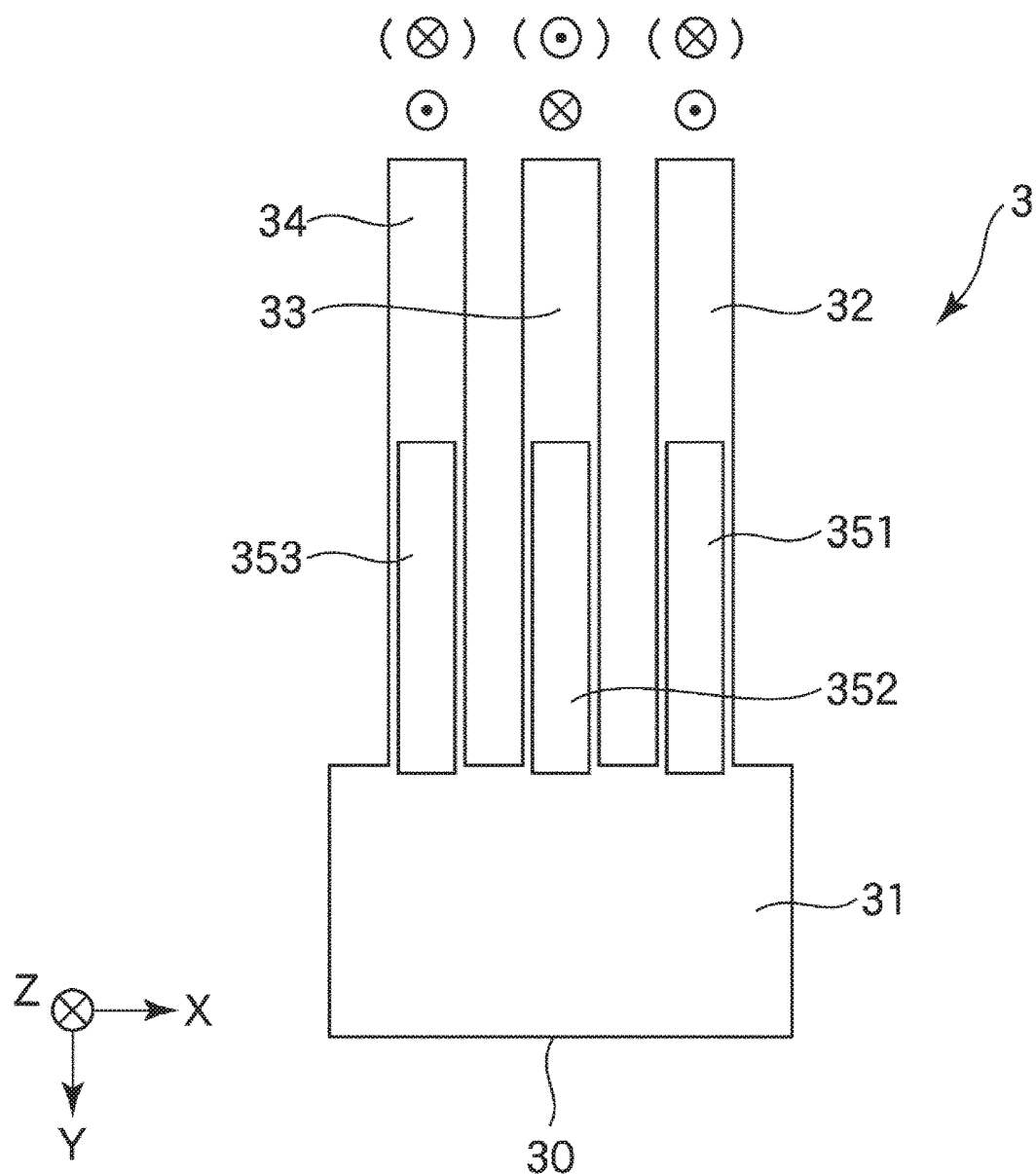
FIG. 22 is a plan view illustrating a resonator element which is provided in a resonator according to a fifth embodiment of the invention.
Figure 23:
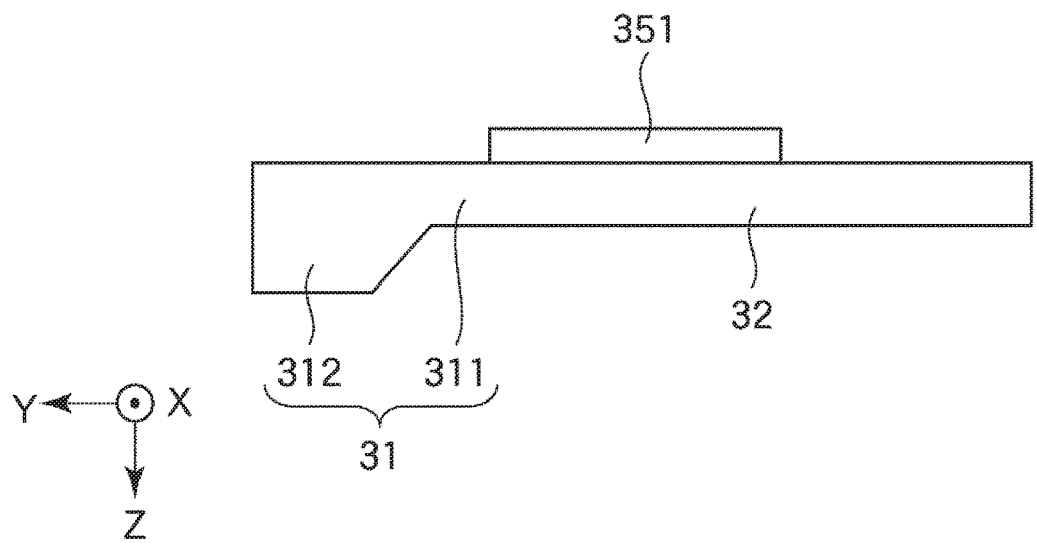
FIG. 23 is a side view of the resonator element illustrated in FIG. 22.

FIG. 22 is a plan view illustrating a resonator element which is provided in the resonator according to the fifth embodiment of the invention. FIG. 23 is a side view of the resonator element illustrated in FIG. 22.

Hereinafter, the resonator of the fifth embodiment is described by focusing on differences from the first embodiment described above, and the same description is omitted.

The resonator according to the fifth embodiment of the invention is the same as that of the first embodiment described above except for a different configuration of the resonator element. Note that the same reference signs are assigned to the same configurations as those in the embodiment described above.

A resonating body 30, which a resonator element 3 of the embodiment has, is formed of the Z cut quartz crystal plate through the patterning using the photolithography method and the etching method (particularly, the wet etching method). As illustrated in FIG. 22, the resonating body 30 includes a base portion 31 and three resonating arms 32, 33, and 34 that extend from the base portion 31 in the −Y-axial direction. Although not illustrated, the resonator element 3 is attached to the base 91 via an adhesive or the like under the base portion 31.

The base portion 31 has a substantial plate shape with the Z-axial direction as the thickness direction. In addition, as illustrated in FIG. 23, the base portion 31 has a thin portion 311 formed to be thin and a thick portion 312 formed to be thicker than the thin portion 311, and the thin and thick portions are provided to be aligned in the Y-axial direction. In addition, the thin portion 311 is formed to have the same thickness as that of the resonating arms 32, 33, and 34.

The resonating arms 32, 33, and 34 are aligned in the X-axial direction, and extend from the base portion 31 in the −Y-axial direction so as to be parallel to each other. A piezoelectric element 351 is disposed on the top surface of the resonating arm 32, a piezoelectric element 352 is disposed on the top surface of the resonating arm 33, and a piezoelectric element 353 is disposed on the top surface of resonating arm 34. The piezoelectric elements 351, 352, and 353 are each energized, thereby contracting and extending in the Y-axial direction. Note that, although not illustrated, electrodes of the piezoelectric elements 351, 352, and 353 are pulled out to the base portion 31, and, for example, are electrically connected to the internal terminal 95 via bonding wires at the base portion 31.

In the resonator element 3, when the piezoelectric elements 351, 352, and 353 are energized, the resonating arms 32 and 34 on both sides and the resonating arm 33 at the center flexurally resonate in reversed-phases in the Z-axial direction. This resonation mode is referred to as the "Z-axial reversed-phase mode (third-direction reversed-phase mode)" and is an inherent resonation mode as the main resonation of the resonator element 3. As described above, the Z-axial reversed-phase mode is the main resonation, and thereby resonations of the resonating arms 32, 33, and 34 are canceled such that the resonation leakage to the base portion 31 is reduced. Therefore, it is possible to realize the high Q value, and thus the resonator element 3 has the low CI value.

Examples of the suprious mode of the resonator element 3 include the X-axial reversed-phase mode, the X-axial in-phase mode, the Z-axial same-phase mode, the torsional reversed-phase mode, the torsional in-phase mode, high-order modes of the modes, and the like.

Also in the fifth embodiment as described above, it is possible to achieve the same effects as those in the first embodiment described above. Note that the quartz crystal plate that configures the resonating body 30 is not limited to the Z cut quartz crystal plate, and an example of the plate includes an X cut quartz crystal plate, an AT cut quartz crystal plate, a BT cut quartz crystal plate, or an ST cut quartz crystal plate. In addition, a configuration material of the resonating body 30 is not limited to piezoelectric material such as a quartz crystal, and a non-piezoelectric material may be used. An example of the non-piezoelectric material includes silicon, quartz, or the like. In addition, a drive method is not limited to the configuration of using the piezoelectric element, and may be configured to use electrostatic drive by using an electrostatic force, or Lorentz drive by using a magnetic force. In addition, as in the fifth embodiment, the configuration of the flexural resonation in the thickness direction (Z-axial direction) is characterized in that it is possible to easily reduce the size by reducing the thickness and it is easy to enter the isothermal region.

Sixth Embodiment

Next, a resonator according to a sixth embodiment of the invention will be described.

Figure 24:
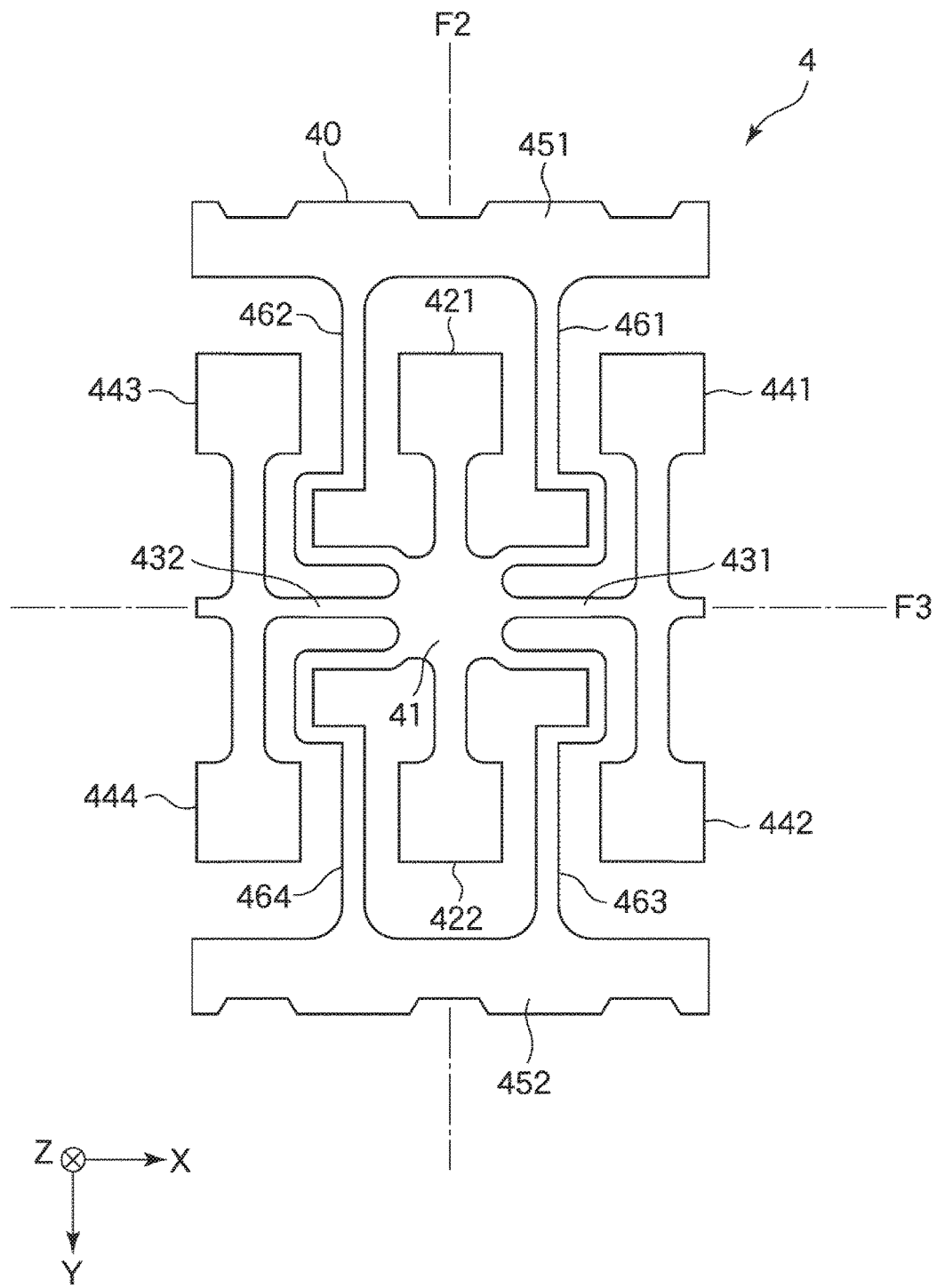
FIG. 24 is a plan view illustrating a resonator element which is provided in a resonator according to a sixth embodiment of the invention.
Figure 25:
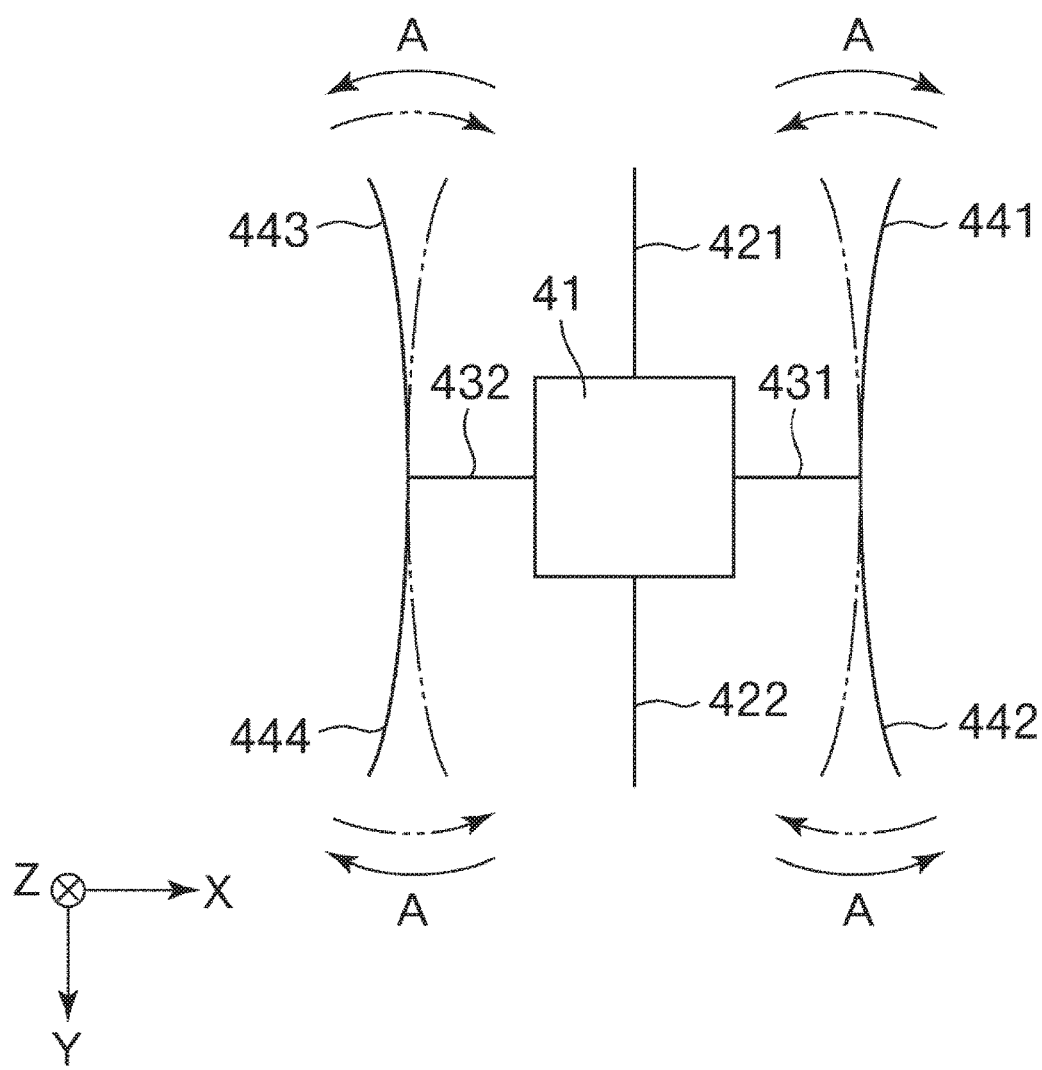
FIG. 25 is a view illustrating an operation of the resonator element illustrated in FIG. 24.
Figure 26:
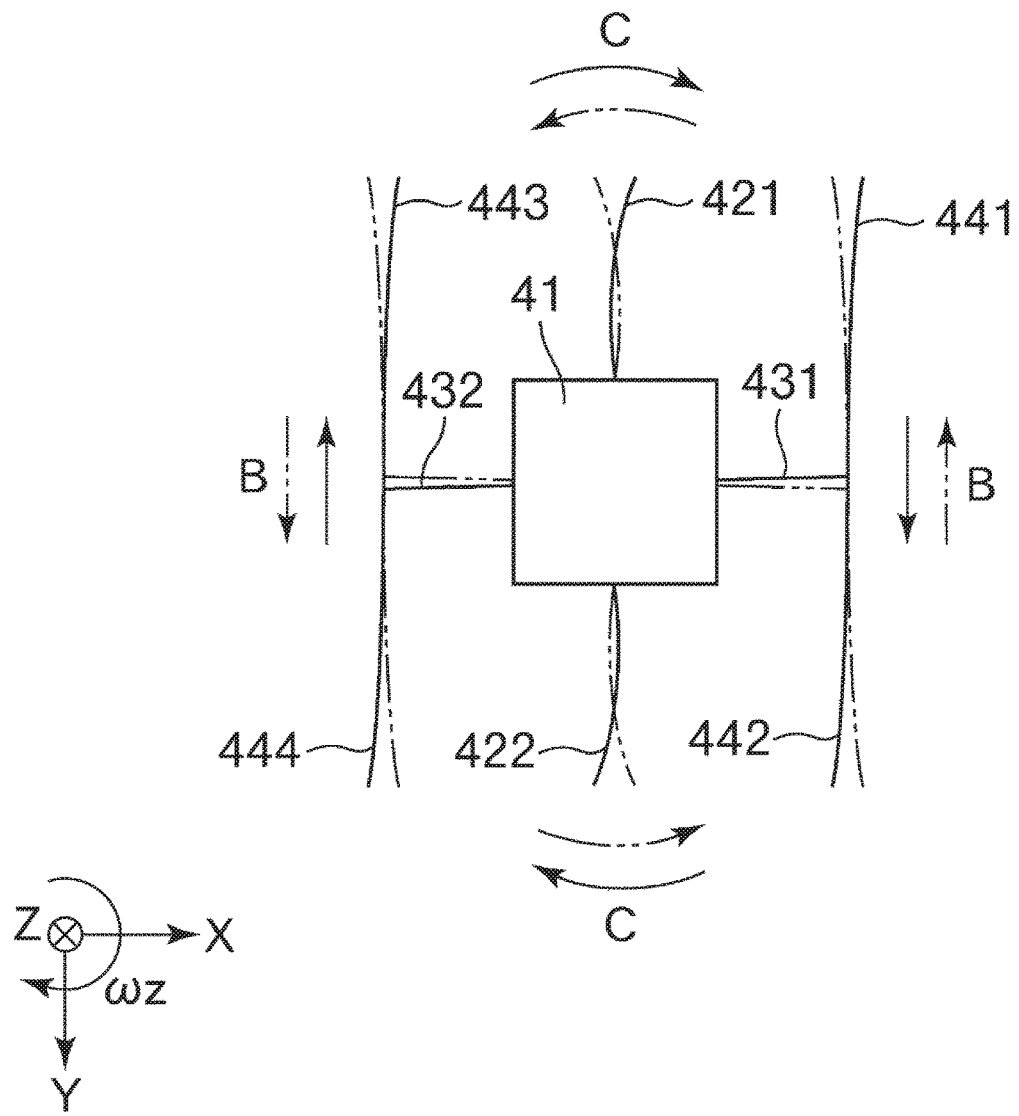
FIG. 26 is a view illustrating another operation of the resonator element illustrated in FIG. 24.

FIG. 24 is a plan view illustrating a resonator element which is provided in the resonator according to the sixth embodiment of the invention. FIGS. 25 and 26 are views, respectively, illustrating operations of the resonator element illustrated in FIG. 24. Note that an electrode is omitted in FIG. 24, for convenience of description.

Hereinafter, the resonator of the sixth embodiment is described by focusing on differences from the first embodiment described above, and the same description is omitted.

The resonator according to the sixth embodiment of the invention is the same as that of the first embodiment described above except for a different configuration of the resonator element. Note that the same reference signs are assigned to the same configurations as those in the embodiment described above.

A resonator element 4 of the embodiment illustrated in FIG. 24 is an angular velocity detecting element that is capable of detecting angular velocity. The resonator element includes a resonating body 40 and an electrode (not illustrated) that is provided on the resonating body 40.

The resonating body 40 is formed of the Z cut quartz crystal plate through the patterning using the photolithography method and the etching method (particularly, the wet etching method). The resonating body 40 includes a base portion 41, detecting arms 421 and 422 as the resonating arms that extend from the base portion 41 on both sides in the Y-axial direction, connecting arms 431 and 432 that extend from the base portion 41 on both sides in the X-axial direction, drive arms 441 and 442 as the resonating arms that extend from the connecting arms 431 on both sides in the Y-axial direction, drive arms 443 and 444 as the resonating arms that extend from the connecting arms 432 on both sides in the Y-axial direction, supports 451 and 452, and beam portions 461, 462, 463, and 464 through which the supports 451 and 452 are connected to the base portion 41. Although not illustrated, the resonator element 4 is attached to the base 91 via the conductive adhesive 97 under the supports 451 and 452.

In addition, a drive signal electrode and a drive ground electrode (not illustrated) are disposed under the drive arms 441 to 444, and the drive arms 441 to 444 flexurally resonate in a direction (the X-axial direction) represented by arrow A in FIG. 25 when a drive signal is applied between the electrodes. The resonation means a drive resonation mode, and this mode is the main resonation of the resonator element 4. On the other hand, a detection signal electrode and a detection ground electrode are disposed under the detecting arms 421 and 422. As illustrated in FIG. 26, when angular velocity ωz is applied around the Z axis in a state in which the drive arms 441 to 444 are caused to resonate in the drive resonation mode, Coriolis force acts on the drive arms 441 to 444 and resonation is excited in a direction represented by arrow B. In response to the resonation, the detecting arms 421 and 422 flexurally resonate in a direction represented by arrow C. Charges generated in the detecting arms 421 and 422 due to the resonation are picked up as a detection signal between the detection signal electrode and the detection ground electrode, and the angular velocity ωz is obtained on the basis of the detection signal.

The resonator element 4 has at least two virtual-resonation symmetry planes as symmetry planes to the main resonations of the drive arms 441 to 444. Specifically, as illustrated in FIG. 24, the resonator element 4 has a first virtual-resonation symmetry plane F2 (YZ plane) and a second virtual-resonation symmetry plane F3 (XZ plane). Therefore, the resonations of the drive arms 441, 442, 443, and 444 are canceled, and thus resonation energy is unlikely to leak. Hence, it is possible to reduce the decrease in the Q value.

Also in the sixth embodiment as described above, it is possible to achieve the same effects as those in the first embodiment described above.

Seventh Embodiment

Next, a resonator according to a seventh embodiment of the invention will be described.

Figure 27:
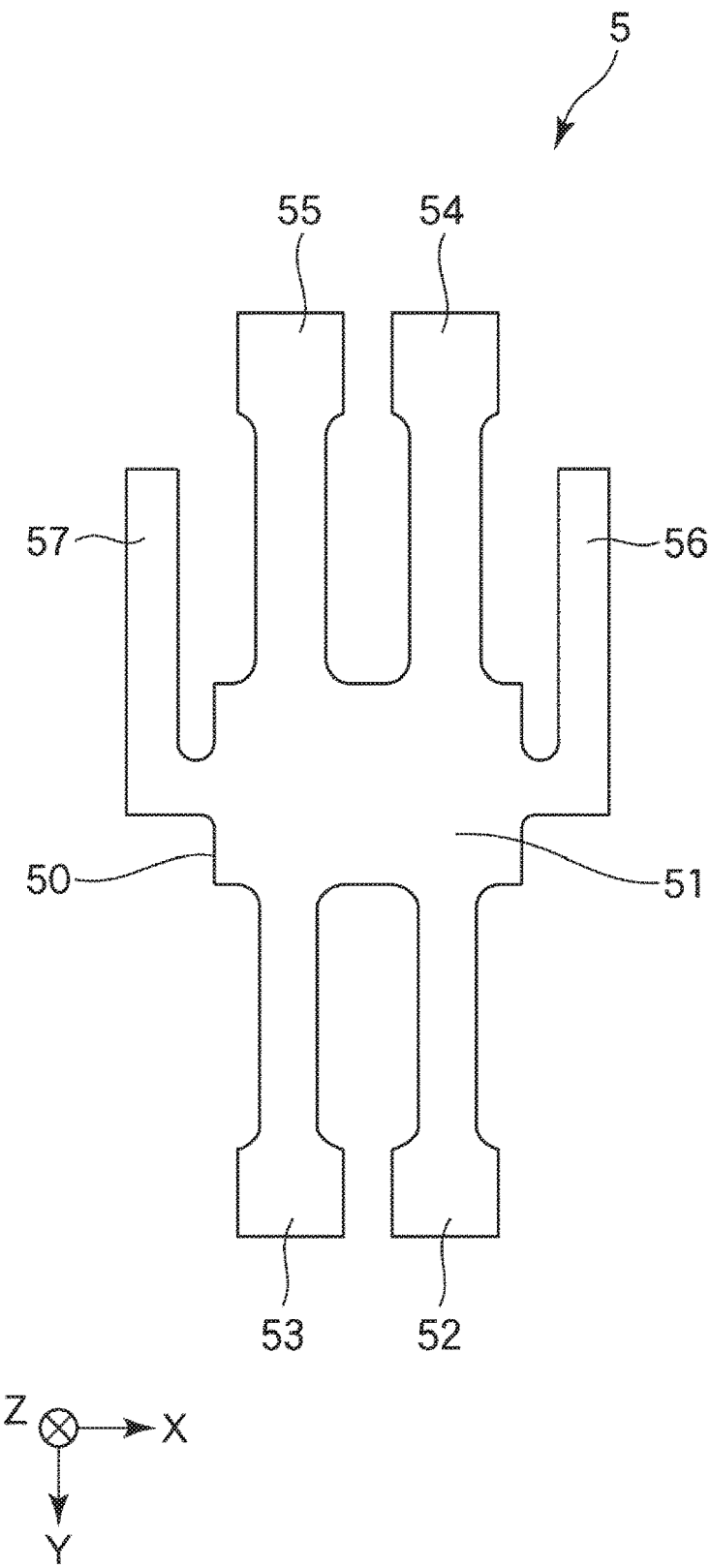
FIG. 27 is a plan view illustrating a resonator element which is provided in a resonator according to a seventh embodiment of the invention.
Figure 28:
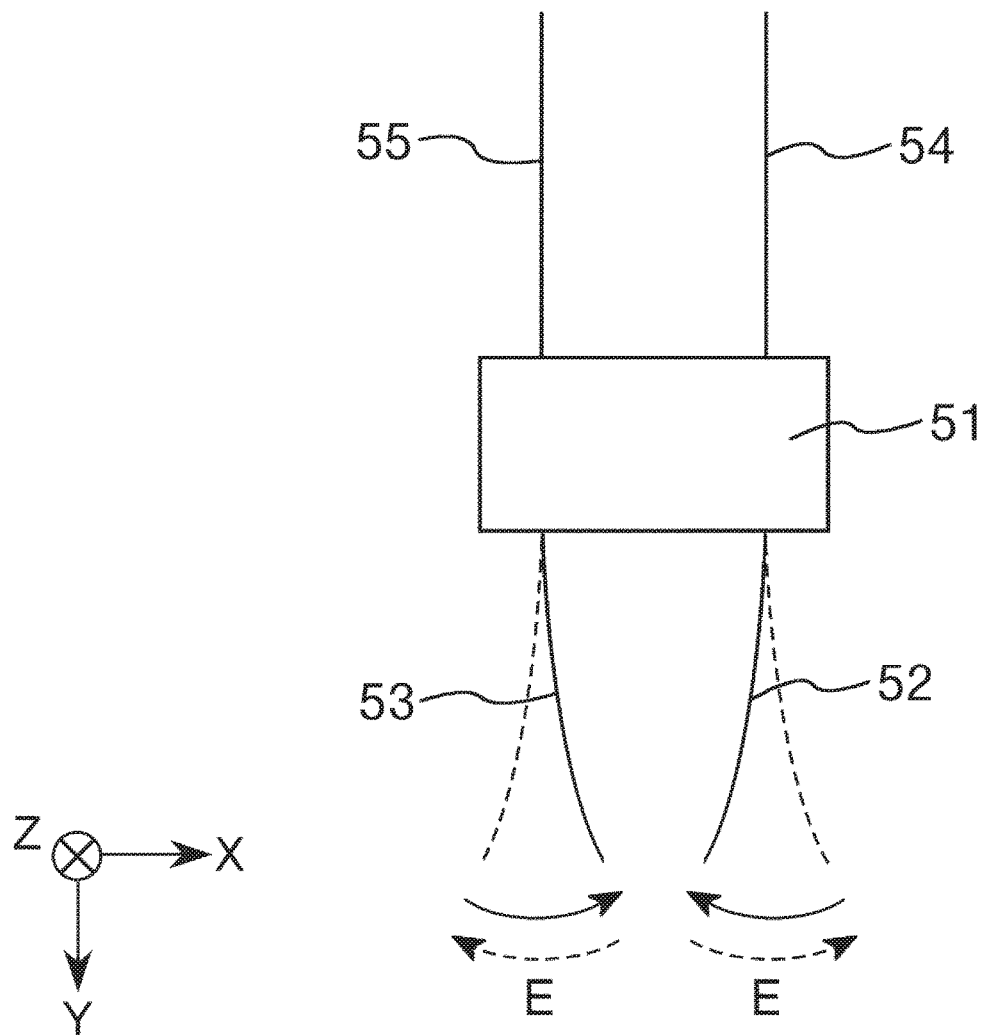
FIG. 28 is a view illustrating an operation of the resonator element illustrated in FIG. 27.
Figure 29:
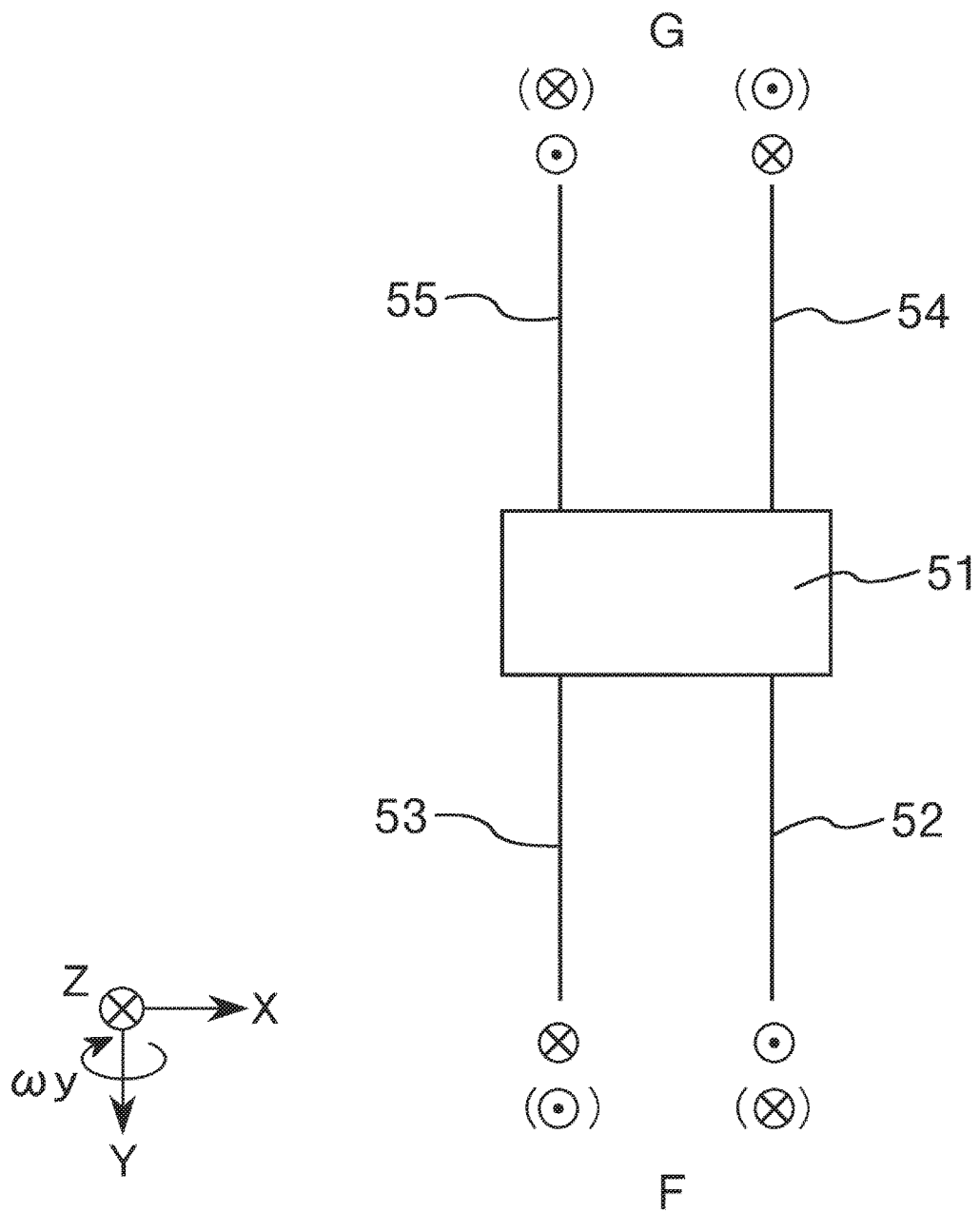
FIG. 29 is a view illustrating another operation of the resonator element illustrated in FIG. 27.

FIG. 27 is a plan view illustrating a resonator element which is provided in the resonator according to the seventh embodiment of the invention. FIGS. 28 and 29 are views, respectively, illustrating operations of the resonator element illustrated in FIG. 27. Note that an electrode is omitted in FIG. 27, for convenience of description.

Hereinafter, the resonator of the seventh embodiment is described by focusing on differences from the first embodiment described above, and the same description is omitted.

The resonator according to the seventh embodiment of the invention is the same as that of the first embodiment described above except for a different configuration of the resonator element. Note that the same reference signs are assigned to the same configurations as those in the embodiment described above.

A resonator element 5 of the embodiment illustrated in FIG. 27 is the angular velocity detecting element that is capable of detecting angular velocity. The resonator element includes a resonating body 50 and an electrode (not illustrated) that is provided on the resonating body 50.

The resonating body 50 is formed of the Z cut quartz crystal plate through the patterning using the photolithography method and the etching method (particularly, the wet etching method). The resonating body 50 includes a base portion 51, drive arms 52 and 53 as the pair of resonating arms that extends from the base portion 51 in the +Y-axial direction, detecting arms 54 and 55 as the pair of resonating arms that extend from the base portion 51 in the −Y-axial direction, and a pair of support arms 56 and 57 that extends from the base portion 51 on both sides in the X-axial direction, are bent at an intermediate portion, and extends in the −Y-axial direction. Although not illustrated, the resonator element 5 is attached to the base 91 via the conductive adhesive 97 under the support arms 56 and 57.

In addition, the drive signal electrode and the drive ground electrode (not illustrated) are disposed under the drive arms 52 and 53, and the drive arms 52 and 53 flexurally resonate in the X-axial reversed-phase mode as illustrated by arrow E in FIG. 28 when the drive signal is applied between the electrodes. The resonation means a drive resonation mode, and this mode is the main resonation of the resonator element 4. On the other hand, the detection signal electrode and the detection ground electrode are disposed under the detecting arms 54 and 55. As illustrated in FIG. 29, when angular velocity ωy is applied around the Y axis in a state in which the drive arms 52 and 53 are caused to resonate in the drive resonation mode, Coriolis force acts on the drive arms 52 and 53 and resonation is excited in a direction represented by arrow F. In response to the resonation, the detecting arms 54 and 55 flexurally resonate in a direction represented by arrow G. Charges generated in the detecting arms 54 and 55 due to the resonation are picked up as the detection signal between the detection signal electrode and the detection ground electrode, and the angular velocity ωy is obtained on the basis of the detection signal.

Also in the seventh embodiment as described above, it is possible to achieve the same effects as those in the first embodiment described above.

Eighth Embodiment

Next, an oscillator according to an eighth embodiment of the invention will be described.

Figure 30:
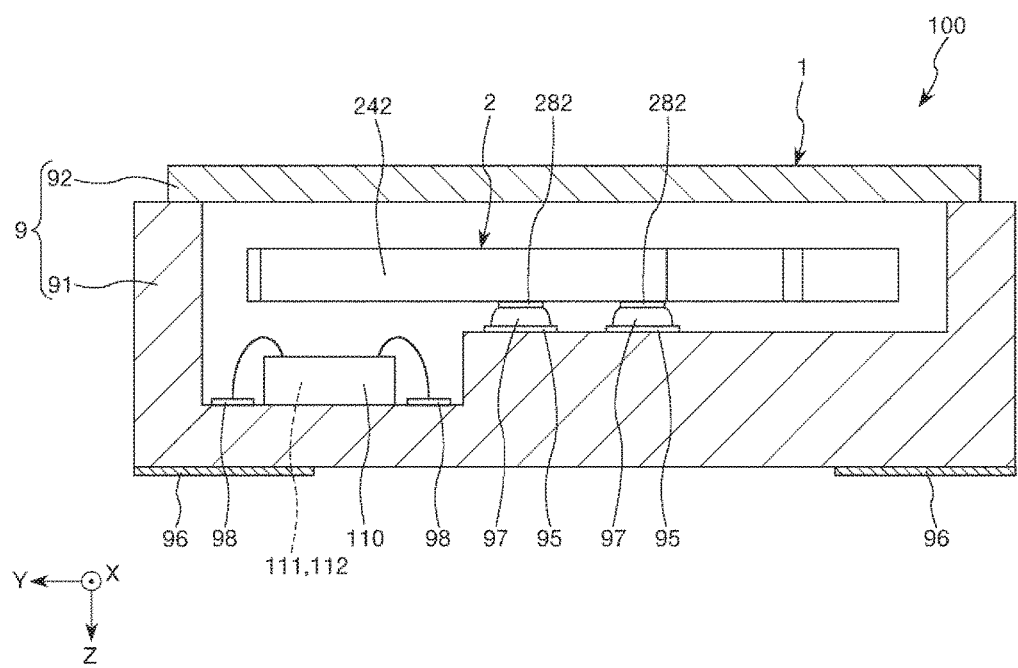
FIG. 30 is a sectional view illustrating an oscillator according to an eighth embodiment of the invention.

FIG. 30 is a sectional view illustrating the oscillator according to the eighth embodiment of the invention.

An oscillator 100 illustrated in FIG. 30 includes the resonator 1 and an IC 110 that is accommodated in the package 9 that is provided in the resonator 1 and is electrically connected to the resonator element 2. The IC 110 is fixed to the bottom surface of the recessed portion 911 of the base 91 and is electrically connected to a plurality of internal terminals 98. The plurality of internal terminals 98 include the internal terminals that are electrically connected to the internal terminal 95, and the internal terminals that are electrically connected to the external terminal 96. In addition, the IC 110 includes an oscillation circuit 111 that drives the resonator element 2, and a temperature compensating circuit 112 that compensates a change in the frequency in response to a temperature change of the resonator element 2. The temperature compensating circuit 112 is provided, and thereby it is possible to perform temperature compensation on a resonance frequency at which the oscillation circuit 111 oscillates, and thus an oscillator 100 having good temperature characteristics is obtained. In the oscillator 100, it is preferable that a shift in an oscillation frequency within a range of an actuation temperature range (for example, a range of −40° C. to 85° C., a range of −40° C. to 150° C. in a vehicle-mounted oscillator) is 5 [ppm] or smaller, and it is more preferable that the shift is 1 [ppm] or smaller, and it is most preferable that the shift is 0.5 [ppm] or smaller. In this manner, the accuracy of the frequency is more improved. Note that a resonance frequency at normal temperature (25° C.) is set as a reference of sign ppm.

According to the oscillator 100, since the resonator 1 having high accuracy of the frequency is used, it is possible to obtain very high accuracy of the frequency.

Electronic Apparatus

Next, an electronic apparatus according to the invention will be described.

Figure 31:
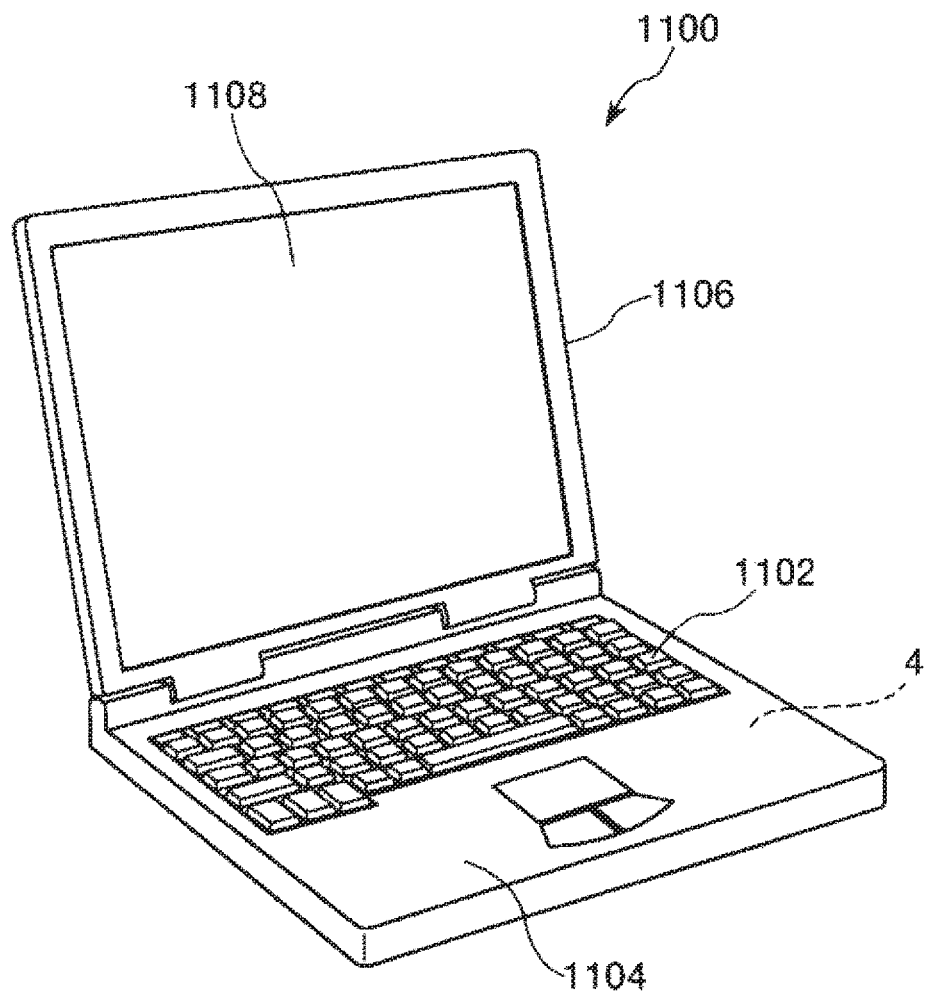
FIG. 31 is a perspective view illustrating a configuration of a mobile type (or notebook type) personal computer to which an electronic apparatus of the invention is applied.

FIG. 31 is a perspective view illustrating a configuration of a mobile-type (or notebook-type) personal computer to which the electronic apparatus according to the invention is applied. In FIG. 31, a personal computer 1100 is configured to include a body portion 1104 that includes a keyboard 1102, and a display unit 1106 that includes a display portion 1108, and the display unit 1106 is rotatably supported by the body portion 1104 via a hinge structure portion. The personal computer 1100 is equipped with the resonator 1.

Figure 32:
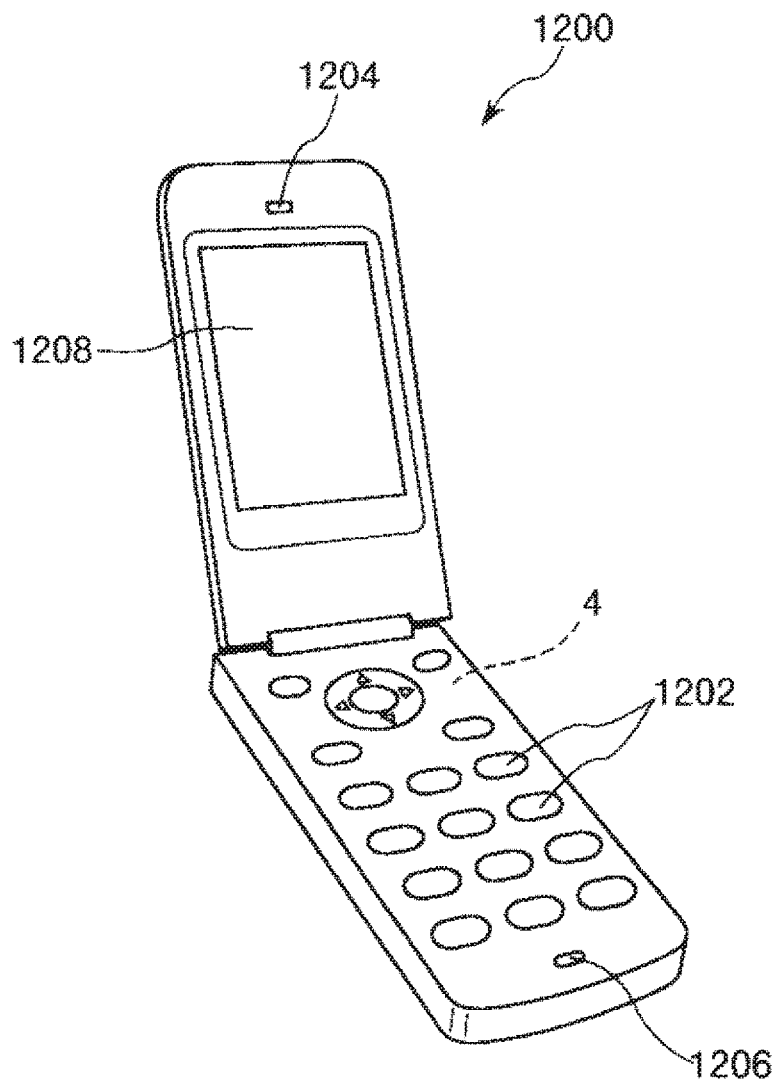
FIG. 32 is a perspective view illustrating a configuration of a mobile phone (also including a smart phone, a PHS, or the like) to which the electronic apparatus of the invention is applied.

FIG. 32 is a perspective view illustrating a configuration of a mobile phone (including a smart phone, a PHS, or the like) to which the electronic apparatus according to the invention is applied. As illustrated in FIG. 32, a mobile phone 1200 includes an antenna (not illustrated), a plurality of operating buttons 1202, an earpiece 1204, and a mouthpiece 1206, in which a display portion 1208 is disposed between the operating buttons 1202 and the earpiece 1204. Such a mobile phone 1200 is equipped with the resonator 1.

Figure 33:
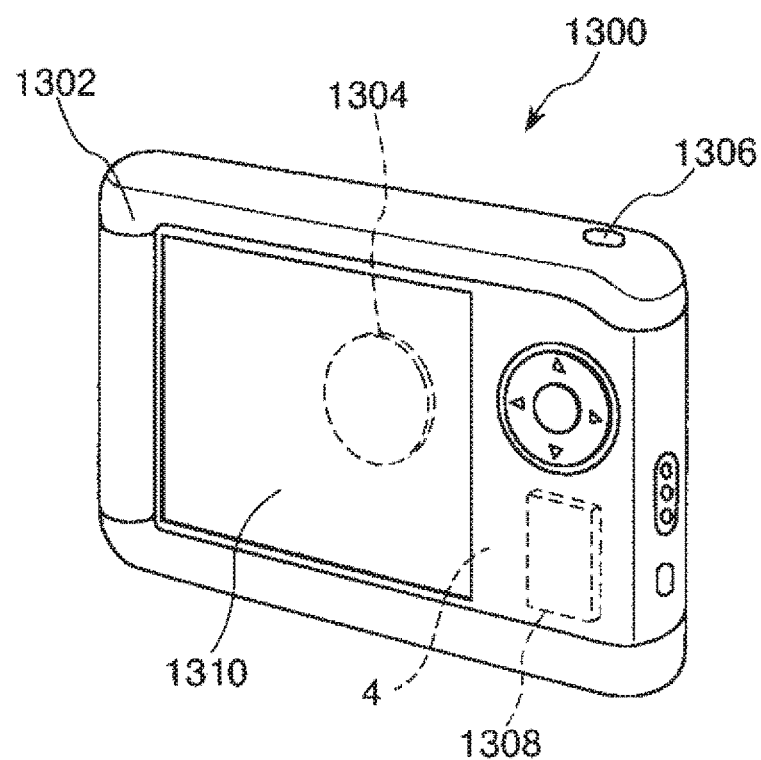
FIG. 33 is a perspective view illustrating a configuration of a digital still camera to which the electronic apparatus of the invention is applied.

FIG. 33 is a perspective view illustrating a configuration of a digital still camera to which the electronic apparatus according to the invention is applied. In FIG. 33, a digital still camera 1300 is provided with a display portion 1310 that is provided on the back surface of a case (body) 1302 and has a configuration in which a display is performed on the basis of an imaging signal by the CCD, and the display portion 1310 functions as a finder to display a subject as an electronic image. In addition, a light receiving unit 1304 that includes an optical lens (imaging optical system), a CCD, or the like is provided on the front surface side (rear surface side in FIG. 33) of the case 1302. When a photographer checks an image of a subject displayed on the display portion 1310 and presses a shutter button 1306, an imaging signal of the CCD at the time point is transmitted to and stored in a memory 1308. The digital still camera 1300 is equipped with the resonator 1.

Since the electronic apparatus uses the resonator 1 having high accuracy of the frequency, very high accuracy of the frequency is obtained. As a result, it is possible to reduce power consumption of the electronic apparatus. This is because the very high accuracy of the frequency is achieved, thereby it is possible to accurately match a timing of communication with another electronic apparatus, and thus it is possible to shorten time taken for the communication.

Note that the electronic apparatus according to the invention can be applied to, in addition to the personal computer in FIG. 31, the mobile phone in FIG. 32, and the digital still camera in FIG. 33, a smart phone, a tablet terminal, a timepiece (including a smart watch), an ink jet type discharge apparatus (for example, an ink jet printer), a laptop personal computer, a TV, a wearable terminal such as a head-mounted display (HMD), a video camera, a video tape recorder, a car navigation device, a pager, an electronic organizer (including a communicating function), an electronic dictionary, a calculator, an electronic game device, a word processor, a workstation, a TV phone, a security television monitor, electronic binoculars, a POS terminal, a medical apparatus (for example, an electronic thermometer, a sphygmomanometer, a blood glucose meter, an electrocardiogram measuring device, an ultrasonic diagnostic apparatus, or an electronic endoscope), a fishfinder, various measurement apparatuses, meters (for example, meters on a vehicle, an aircraft, or a ship), a flight simulator, or the like.

Vehicle

Next, a vehicle according to the invention will be described.

Figure 34:
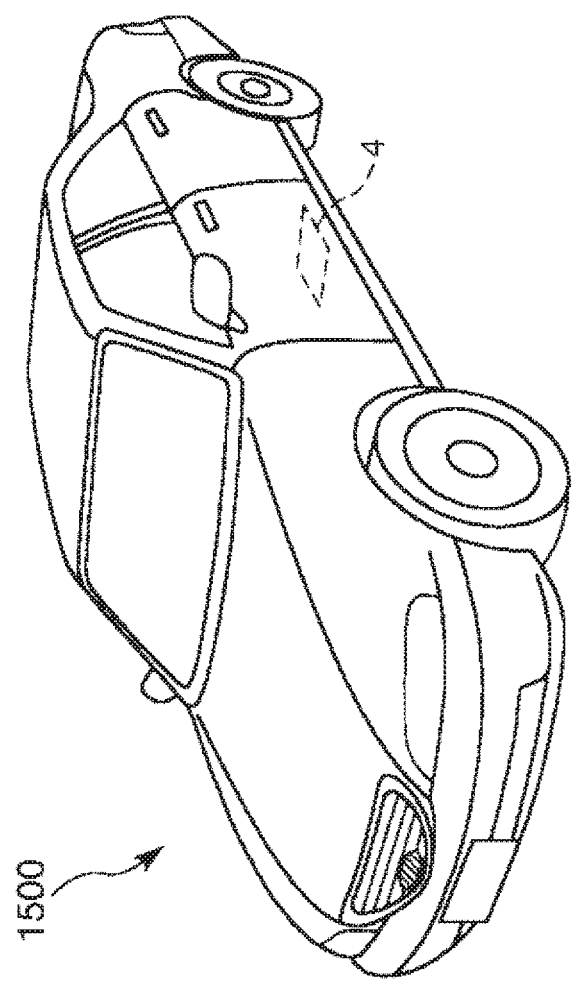
FIG. 34 is a perspective view illustrating an automobile to which a vehicle of the invention is applied.
Figure 35:
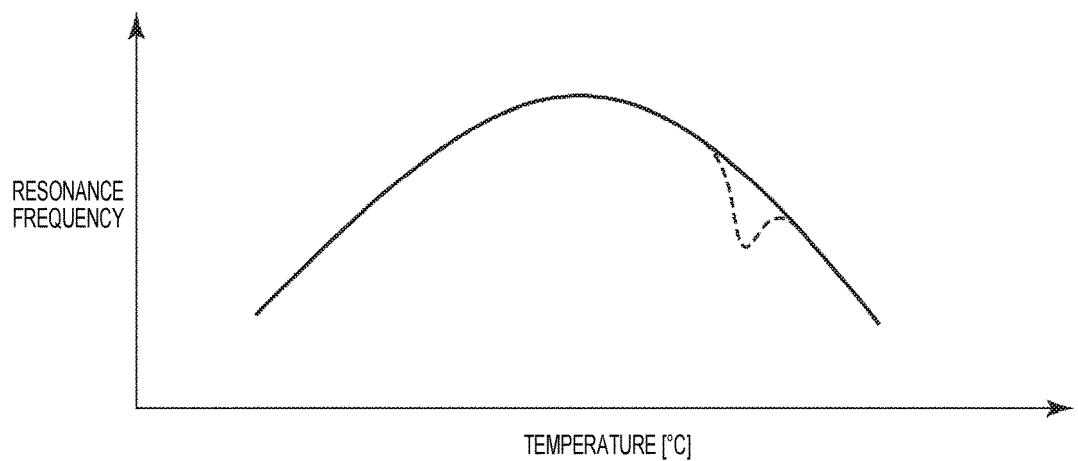
FIG. 35 is a graph illustrating an example of frequency-temperature characteristics of a resonator element in order to illustrate problems of the related art.
Figure 36:
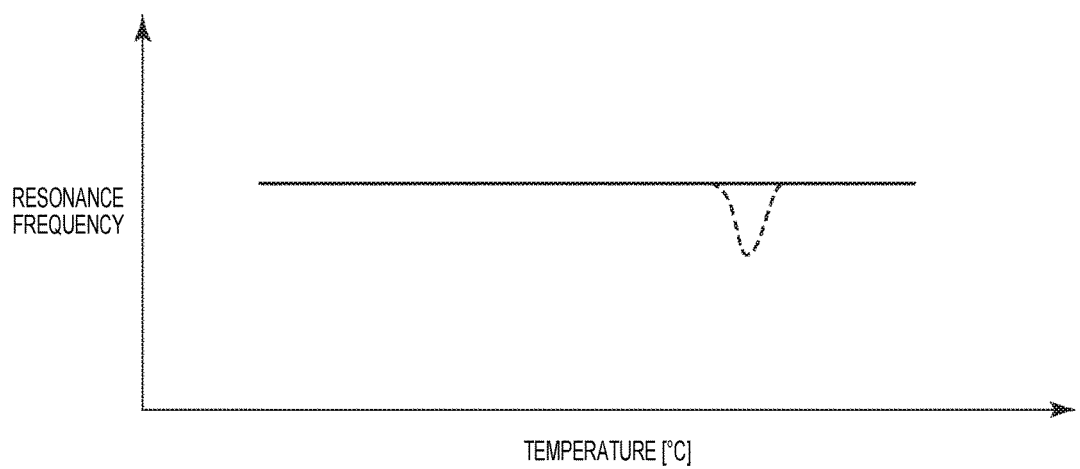
FIG. 36 is a graph illustrating an example of frequency-temperature characteristics after correction by a temperature compensated circuit in order to illustrate problems of the related art.

FIG. 34 is a perspective view illustrating an automobile to which a vehicle according to the invention is applied. In FIG. 34, an automobile 1500 is equipped with the resonator 1. The resonator 1 can be widely applied to an electronic control unit (ECU), such as keyless entry, an immobilizer, a car navigation system, a car air conditioner, an anti-lock brake system (ABS), an airbag, a tire pressure monitoring system (TPMS), an engine control, a battery monitor of a hybrid car or an electric car, or a vehicle body posture control system.

Since the vehicle uses the resonator 1 having the high accuracy of the frequency, very high accuracy of the frequency is obtained. As a result, it is possible to reduce power consumption of the vehicle. This is because the very high accuracy of the frequency is achieved, thereby it is possible to accurately match the timing of communication with another electronic apparatus or vehicle, and thus it is possible to shorten time taken for the communication.

As described above, the resonator, the oscillator, the electronic apparatus, and the vehicle according to the invention are described on the basis of the embodiments in the figures; however, the invention is not limited thereto, and it is possible to replace the configurations of the portions with portions having any configurations with the same functions. In addition, another constituent may be added to the invention. In addition, the embodiment described above may be appropriately combined.

In addition, in the embodiments described above, the resonating body is configured of the quartz crystal; however, the configurational material of the resonating body is not limited to the quartz crystal, and an example of the configurational material includes an oxide substrate of aluminum nitride (AlN), lithium niobate (LiNbO$_3$), lithium tantalate (LiTaO$_3$), lead zirconate titanate (PZT), lithium tetraborate (Li$_2$B$_4$O$_7$), langasite crystal (La$_3$Ga$_5$SiO$_{14}$), potassioum niobate (KNbO$_3$), gallium phosphate (GaPO$_4$), gallium arsenide (GaAs), aluminum nitride (AlN), zinc oxide (ZnO or Zn$_2$O$_3$), barium titanate (BaTiO$_3$), lead titanate (PbPO$_3$), sodium potassium niobate ((K, Na) NbO$_3$), bismuth ferrite (BiFeO$_3$), sodium niobate (NaNbO$_3$), bismuth titanate (Bi$_4$Ti$_3$O$_{12}$), bismuth sodium titanate (Na$_{0.5}$Bi$_{0.5}$TiO$_3$), or the like, a laminated piezoelectric substrate configured by laminating piezoelectric materials of aluminum nitride, tantalum pentoxide (Ta$_2$O$_5$), or the like on a glass substrate, or piezoelectric ceramics.

What is claimed is:

1. A resonator comprising:
a resonator element that includes a base portion and a resonating arm extending from the base portion in a first direction; and
a base to which the resonator element is attached, wherein the resonator is configured such that:
when n is one natural number of 2 or greater, and j is 1 or greater and a natural number which is less than or equal to n, the resonator element performs resonations with n inherent resonation modes that have different resonance frequencies from one another;
the n inherent resonation modes include an inherent resonation mode of main resonation;
in a relationship between arbitrary integers k$_j$ and resonance frequencies f$_j$ corresponding to the n inherent resonation modes, respectively, when f$_1$ represents a resonance frequency of the main resonation and a normalized frequency difference Δf is defined by $$\Delta f \equiv \left( \frac{\sum_{j=2}^{n} k_j f_j}{-k_1} - f_1 \right) \bigg/ f_1,$$

a relationship of |Δf|≥0.03 is satisfied;
the arbitrary integers k$_j$ satisfy relationships of and $3 \leq \sum_{j=1}^{n} |k_j| \leq 10$ and $n \leq \sum_{j=1}^{n} |k_j|$; and
a ratio of a value obtained by normalizing, by the resonance frequency f$_1$ of the main resonation, an amount of a change in the resonance frequency of the main resonation, to a change in excitation power that electrically excites the main resonation, is 20 [ppm/μW] or higher.

2. The resonator according to claim 1, wherein a relationship of $3 \leq \sum_{j=1}^{n} |k_j| \leq 6$ is satisfied.

3. The resonator according to claim 1, wherein the resonator element includes a pair of resonating arms that is aligned in a second direction intersecting with the first direction and extends from the base portion in the first direction, and
wherein the resonator element has high-order modes of at least two inherent resonation modes of
a second-direction reversed-phase mode in which the pair of resonating arms flexurally resonates in reversed-phases in the second direction,
a second-direction same-phase mode in which the pair of resonating arms flexurally resonates in the same phase in the second direction,
a third-direction reversed-phase mode in which the pair of resonating arms flexurally resonates in reversed-phases in a third direction which is parallel to a thickness direction of the base portion,
a third-direction same-phase mode in which the pair of resonating arms flexurally resonates in the same phase in the third direction,
a torsional reversed-phase mode in which the pair of resonating arms is twisted in reversed-phases around axes extending in the first direction, respectively, and
a torsional in-phase mode in which the pair of resonating arms is twisted in the same phase around the axes extending in the first direction, respectively.

4. The resonator according to claim 3,
wherein the main resonation is the second-direction reversed-phase mode.

5. The resonator according to claim 4,
wherein the resonating arm has a groove that is open on a main plane,
wherein, when the resonating arm has a length of L [m] in the first direction, at least a part of the groove is provided between a base end of the resonating arm and a position separated from the base end to a tip end side by L/3, and
wherein, when the resonating arm has a length of W [m] in a resonating direction of the main resonation, a relationship of $W > W_0$ is satisfied,
provided that, $$W_0 = \sqrt{\frac{\pi k}{2\rho C_p f_1}},$$

$\rho$ [kg/m$^3$] represents a mass density of the resonating arm,
$C_p$ [J/(kg·K)] represents heat capacity of the resonating arm, and
k [W/(m·K)] represents thermal conductivity of the resonating arm in the resonating direction of the main resonation.

6. The resonator according to claim 4,
wherein, when the resonating arm has a length of W [m] in a resonating direction of the main resonation,
a relationship of $W < W_0$ is satisfied,
provided that, $$W_0 = \sqrt{\frac{\pi k}{2\rho C_p f_1}},$$

$\rho$ [kg/m$^3$] represents a mass density of the resonating arm,
$C_p$ [J/(kg·K)] represents heat capacity of the resonating arm, and
k [W/(m·K)] represents thermal conductivity of the resonating arm in the resonating direction of the main resonation.

7. The resonator according to claim 1,
wherein, when a Q value of the resonator element is Q, a relationship of $$Q \geq \frac{\rho C_p}{c\alpha^2 \Theta} \times \frac{1 + \left(\frac{f_1}{f_{0max}}\right)^2}{\frac{f_1}{f_{0max}}}$$

is satisfied, provided that, $$f_{0max} = \frac{\pi k}{2\rho C_p W_{emin}^2}$$

and
$W_{emin} = C(AL+B)$,
$A = 7.3690 \times 10^{-2}$,
$B = 1.2544 \times 10^{-5}$,
$C = 1.1$ to $1.3$,
$\rho$ [kg/m$^3$] represents a mass density of the resonating arm,
$C_p$ [J/(kg·K)] represents heat capacity of the resonating arm,
c [N/m$^2$] represents an elastic constant related to an extending direction of the resonating arm,
$\alpha$ [1/K] represents a coefficient of thermal expansion related to the extending direction of the resonating arm,
$\Theta$ [K] represents ambient temperature,
k [W/(m·K)] represents thermal conductivity of the resonating arm in a resonating direction of the main resonation, and
$\pi$ represents a ratio of a circumference of a circle to a diameter.

8. The resonator according to claim 3,
wherein the main resonation is the third-direction reversed-phase mode.

9. The resonator according to claim 1,
wherein the inherent resonation modes include modes of flexural resonations of the resonating arm in a direction orthogonal to a resonating direction of the main resonation.

10. An oscillator comprising:
the resonator according to claim 1; and
an oscillation circuit.

11. An oscillator comprising:
the resonator according to claim 2; and
an oscillation circuit.

12. An oscillator comprising:
the resonator according to claim 3; and
an oscillation circuit.

13. An oscillator comprising:
the resonator according to claim 4; and
an oscillation circuit.

14. An electronic apparatus comprising:
the resonator according to claim 1.

15. An electronic apparatus comprising:
the resonator according to claim 2.

16. An electronic apparatus comprising:
the resonator according to claim 3.

17. An electronic apparatus comprising:
the resonator according to claim 4.

18. A vehicle comprising:
the resonator according to claim 1.

19. A vehicle comprising:
the resonator according to claim 2.

20. A vehicle comprising:
the resonator according to claim 3.

* * * * *